US009356038B2

(12) United States Patent
Lee et al.

(10) Patent No.: US 9,356,038 B2
(45) Date of Patent: May 31, 2016

(54) SEMICONDUCTOR DEVICE AND METHOD OF FABRICATING THE SAME

(71) Applicant: SK hynix Inc., Gyeonggi-do (KR)

(72) Inventors: Ki Hong Lee, Gyeonggi-do (KR); Seung Ho Pyi, Gyeonggi-do (KR); Seok Min Jeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/465,573

(22) Filed: Aug. 21, 2014

(65) Prior Publication Data

US 2015/0255385 A1     Sep. 10, 2015

(30) Foreign Application Priority Data

Mar. 6, 2014   (KR) .................. 10-2014-0026639

(51) Int. Cl.
| H01L 23/522 | (2006.01) |
| H01L 23/528 | (2006.01) |
| H01L 23/532 | (2006.01) |
| H01L 27/115 | (2006.01) |

(52) U.S. Cl.
CPC .... *H01L 27/11575* (2013.01); *H01L 27/11548* (2013.01); *H01L 27/11556* (2013.01); *H01L 27/11582* (2013.01)

(58) Field of Classification Search
None
See application file for complete search history.

(56) References Cited

U.S. PATENT DOCUMENTS

2008/0073635 A1* 3/2008 Kiyotoshi et al. ............ 257/2
2013/0234232 A1    9/2013 Yahashi

FOREIGN PATENT DOCUMENTS

KR    10-2014-0089793    7/2014

OTHER PUBLICATIONS

Translation of KR 10-2014-00489793.*

* cited by examiner

*Primary Examiner* — Pamela E Perkins
(74) *Attorney, Agent, or Firm* — IP & T Group LLP

(57) ABSTRACT

A semiconductor device and a method of fabricating the same are provided. The semiconductor device includes insulating layers stacked in the shape of stairs, and conductive layers alternately stacked with the insulating layers, wherein the conductive layers each include a first region interposed between upper and lower insulating layers thereof, among the insulating layers, and a second region which extends from the first region and protrudes between the upper and lower insulating layers, and wherein a protruding part formed on a sidewall or an upper surface of the second region.

20 Claims, 21 Drawing Sheets

SEMICONDUCTOR DEVICE AND METHOD OF FABRICATING THE SAME

CROSS-REFERENCE TO RELATED APPLICATIONS

The present application claims priority to Korean patent application number 10-2014-0026639 filed on Mar. 6, 2014, the entire disclosure of which is incorporated herein in its entirety by reference.

BACKGROUND

1. Field of Invention

Various exemplary embodiments of the present invention relate to a semiconductor device and a method of fabricating the same, and more particularly, to a semiconductor device having a 3-dimensional structure and a method of fabricating the same.

2. Description of Related Art

Nonvolatile memory devices are memory devices that retain stored data even when their power supplies are interrupted. Since a 2-dimensional nonvolatile memory device configured to form a memory cell in a single-layer on a silicon substrate has reached a limit in enhancing its degree of integration, a 3-dimensional nonvolatile memory device configured to vertically stack memory cells on the silicon substrate has been proposed.

The 3-dimensional nonvolatile memory device includes interlayer insulating layers and word lines, which are alternately stacked, and channel layers passing therethrough, and memory cells that are stacked along the channel layers. Further, contact plugs are formed in contact with the stacked word lines, respectively, to selectively drive the memory cells.

However, because contact plugs having various depths have to be formed in order to implement this structure, there is a high degree of difficulty in manufacturing such semiconductor devices. Further, it is likely to cause a bridge where the contact plugs pass through the word lines.

SUMMARY

The present invention is directed to a stable semiconductor device and a simplified method of fabricating the same.

One aspect of the present invention provides a semiconductor device including insulating layers stacked in the shape of stairs, and conductive layers alternately stacked with the insulating layers, wherein the conductive layers each include a first region interposed between upper and lower insulating layers thereof, and a second region which extends from the first region and protrudes between the upper and lower insulating layers, and wherein a protruding part is formed on a sidewall or an upper surface of the second region.

Another aspect of the present invention provides a semiconductor device including insulating layers stacked in the shape of stairs, and conductive layers alternately stacked with the insulating layers wherein the conductive layers each include a pad part protruding between upper and lower insulating layers thereof, among the insulating layers, in the shape of a bird's beak.

Still another aspect of the present invention provides a method of fabricating a semiconductor device including forming a stacked structure including first and second material layers alternately stacked in the shape of stairs, wherein second material layers each include a first region interposed between upper and lower first material layers thereof, and a second region which extends from the first region and covers the lower first material layer, doping impurities into second regions of the second material layers, forming first undercuts under the second material layers by partially removing the first material layers, forming opening parts by removing the first material layers and the second regions of the second material layers, wherein the opening parts have a greater thickness in the second regions than in regions of the first material layers, and forming conductive layers in the opening parts.

Still another aspect of the present invention provides a method of fabricating a semiconductor device including forming a stacked structure including first and second material layers alternately stacked in the shape of stairs, wherein first material layers each include a first region interposed between upper and lower second material layers thereof, and a second region which extends from the first region and covers the lower second material layer, forming insulating patterns over the second region of the first material layers, forming first undercuts under the insulating patterns by partially etching the second region of the first material layers using the insulating patterns as an etch barrier, forming opening parts by removing the first material layers, and forming conductive layers in the opening parts.

BRIEF DESCRIPTION OF THE DRAWINGS

The above and other features and advantages of the present invention will become more apparent to those of ordinary skill in the art by describing in detail exemplary embodiments with reference to the attached drawings in which.

DETAILED DESCRIPTION

Figure 1A:
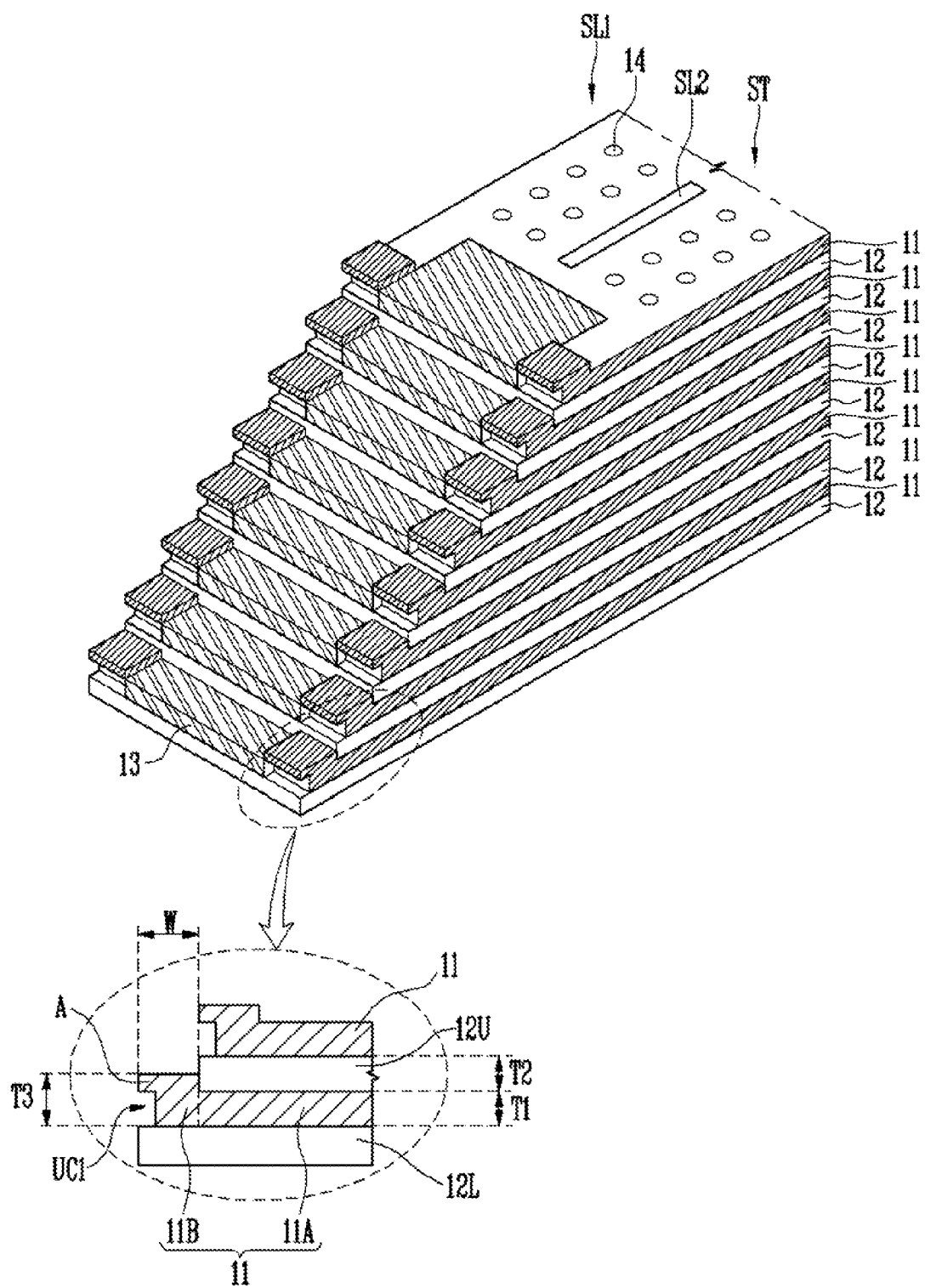
FIGS. 1A to 1D are perspective views showing a structure of a semiconductor device according to an embodiment of the present invention.

Various exemplary embodiments of the present invention will be described. In the drawings, elements and regions are not drawn to scale, and their sizes and thicknesses may be exaggerated for clarity. In the description of the present invention, known configurations that are not central to the principles of the present invention may be omitted. Throughout the drawings and corresponding description, the same components are denoted by the same reference numerals.

FIG. 1A is a perspective view showing a structure of a semiconductor device according to a first embodiment of the present invention. As illustrated in FIG. 1A, the semiconductor device according to the embodiment of the present invention includes a stacked structure ST having a sidewall in the shape of stairs. The stacked structure ST includes conductive layers 11 and insulating layers 12, which are alternately stacked. For example, the insulating layers 12 are stacked in the shape of stairs, and the conductive layers 11 are interposed between the stacked insulating layers 12.

Referring to the enlarged view, each of the conductive layers 11 includes a first region 11A interposed between upper and lower insulating layers 12U and 12L, and a second region 11B protruding from between the upper insulating layer 12U and the lower insulating layer 12L. The first region 11A may be a gate electrode of a select transistor, a memory cell, etc., a word line, or a select line. Further, the second region 11B may be a pad part for connecting a contact plug thereto.

The second region 11B of each of the conductive layers 11 has a greater thickness than the first region 11A (T3>T1). Although the first regions 11A of the conductive layers 11 and the insulating layers 12 are shown to have the same thickness (T1=T2) in FIG. 1A, they may have different thicknesses from each other. For example, the first regions 11A of the conductive layers 11 may be thinner than the insulating layers 12.

The second region 11B of each of the conductive layers 11 may have a bird's beak shape (please see the drawing). For example, each of the conductive layers 11 may include a protruding part (A) formed on a sidewall of the second region 11B. The protruding part (A) may be formed on a part of the sidewall of the second region 11B. As an example, the protruding part (A) is shown to be extended from an upper surface of the conductive layer 11 and located on the sidewall of the second region 11B in FIG. 1A. According to this structure, a first undercut UC1 is located under the protruding part (A). Further, an upper surface of the second region 11B of the conductive layer 11 may be formed at a level equal to or lower than an upper surface of the upper insulating layer 12U corresponding thereto.

For reference, although all of the conductive layers 11 are described to include the second regions 11B of the same width W in FIG. 1A, the conductive layers 11 may include second regions 11B of different widths. For example, at least one uppermost conductive layer 11 and at least one lowermost conductive layer 11 may include the second regions 11B of a greater width than other conductive layers 11.

First slits SL1 are located at both sides of the stacked structure ST. For example, the first slit SL1 is located between the adjacent stacked structures ST. The stacked structure ST may further include sacrificial layers 13 located in a central region, which is spaced apart from the first slit SL1. The sacrificial layers 13 are interposed between the stacked insulating layers 12, and the conductive layer 11 formed in the same layer covering a sidewall of the sacrificial layer 13. In this case, the conductive layers 11 are located in a sidewall of the stacked structure ST exposed through the first slit SL1, that is, in a side region of the stacked structure ST, and the sacrificial layers 13 are located in the central region of the stacked structure ST.

The semiconductor device may further include at least one second slit SL2 and a semiconductor pattern 14 passing through the stacked structure ST. Here, an insulating layer may fill the first and second slits SL1 and SL2. Further, the semiconductor pattern 14 may be a channel layer, and the channel layer may be covered with a multilayered dielectric layer.

According to the above-described structure, the thickness of the second region 11B of the conductive layer 11 may be selectively increased. Therefore, since the thickness of the second region 11B may be increased without increasing the height of the stacked structure, it may be prevented from causing a bridge where a contact plug passes through the conductive layer 11. Specially, because the protruding part (A) is located on the sidewall of the second region 11B of the conductive layer 11 and the first undercut UC1 is formed under the protruding part (A), the distance between the second region 11B of the upper conductive layer 11 and the second region 11B of the lower conductive layer 11 increases by the first undercut UC1. Therefore, a bridge between the stacked conductive layers 11 may be prevented.

Figure 1B:
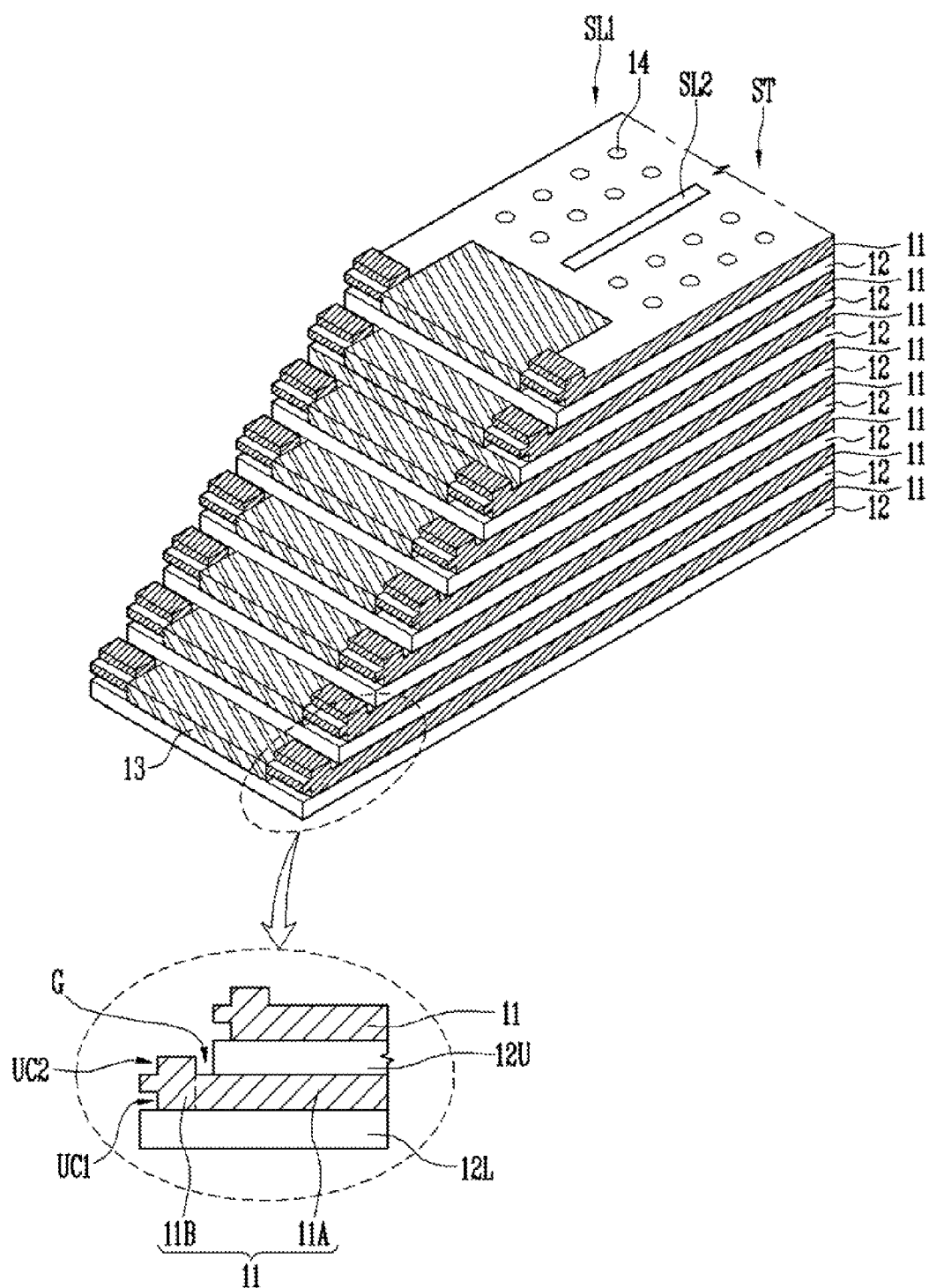

FIG. 1B is a perspective view showing a structure of a semiconductor device according to a second embodiment of the present invention. For the sake of brevity, structures that have been previously explained will not be described again, so, for further clarity, please refer to descriptions and illustrations of previous embodiments.

As illustrated in FIG. 1B, a semiconductor device according to an embodiment of the present invention includes a stacked structure ST including conductive layers 11, insulating layers 12, sacrificial layers 13, semiconductor patterns 14, and a second slit SL2. Further, first slits SL1 are located at both sides of the stacked structure ST.

Referring to the enlarged view, each of the conductive layers 11 includes a first region 11A interposed between upper and lower insulating layers 12U and 12L, and a second region 11B protruding from between the upper insulating layer 12U and the lower insulating layer 12L. The second region 11B of each of the conductive layers 11 has a greater thickness than the first region 11A, and includes a protruding part (A) formed on a sidewall of the second region 11B. The protruding part (A) may be formed on a part of the sidewall of the second region 11B. As an example, the protruding part (A) is located centrally on the sidewall of the second region 11B in FIG. 1B, According to this structure, a first undercut UC1 may be located under the protruding part (A). Further, a groove G may be located between the second region 11B of the conductive layer 11 and the upper insulating layer 12U corresponding thereto.

For reference, although not shown in this drawing, an insulating pattern may be located on the second region 11B of the conductive layer 11, and a second undercut UC2 may be located between the protruding part (A) and the insulating pattern corresponding thereto.

Figure 1C:
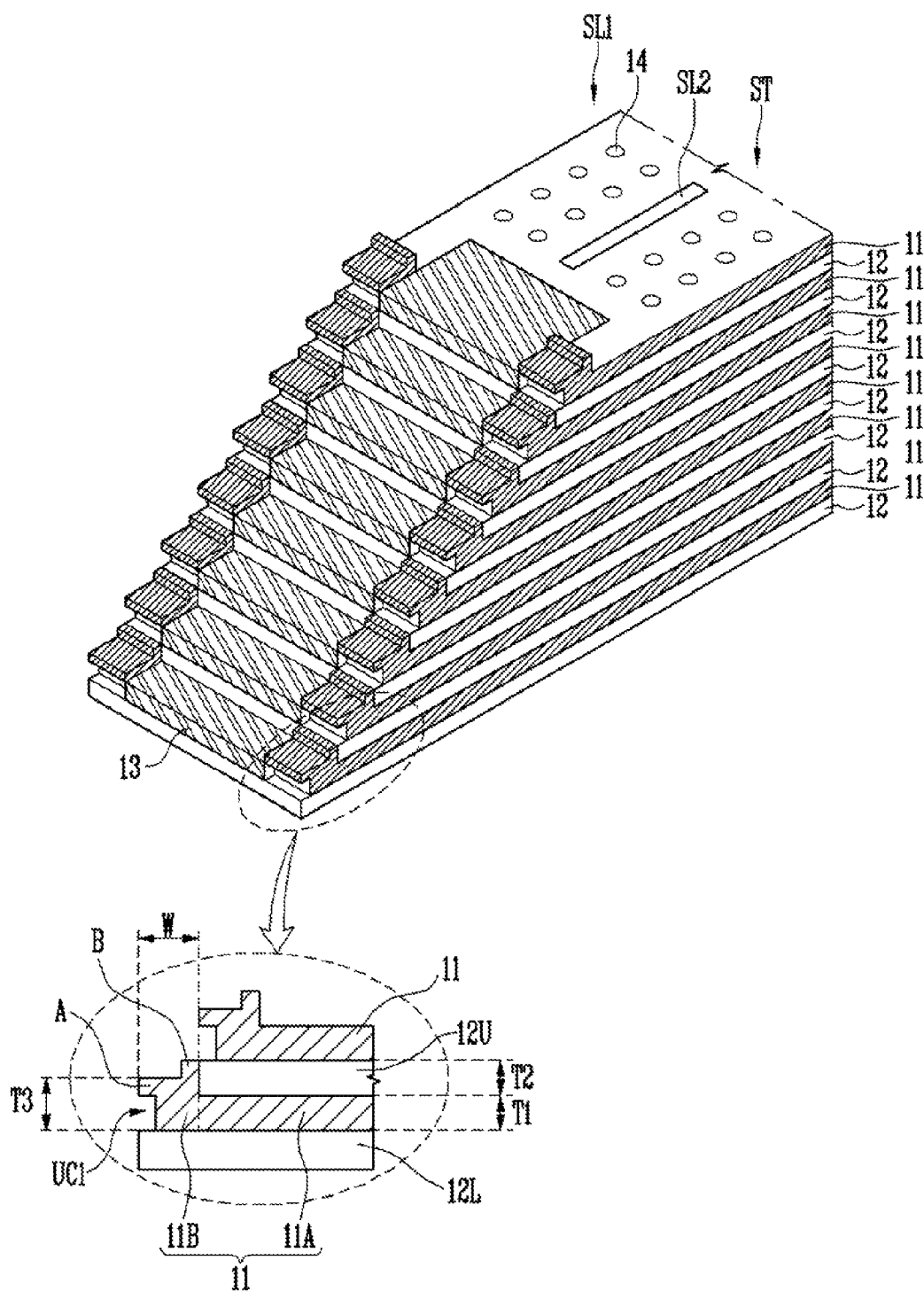

FIG. 1C is a perspective view showing a structure of a semiconductor device according to a third embodiment of the present invention.

As illustrated in FIG. 1C, a semiconductor device according to an embodiment of the present invention includes a stacked structure ST including conductive layers 11, insulating layers 12, sacrificial layers 13, semiconductor patterns 14, and a second slit SL2. Also, first slits SL1 are located at both sides of the stacked structure ST.

Referring to the enlarged view, each of the conductive layers 11 includes a first region 11A interposed between upper and lower insulating layers 12U and 12L and a second region 11B protruding from between the upper insulating layer 12U and the lower insulating layer 12L. The second region 11B of each of the conductive layers 11 may have a greater thickness than the first region 11A and include a first protruding part (A) formed on a sidewall of the second region 11B and a second protruding part (B) formed on an upper surface of the second region 11B. The first protruding part (A) may be formed on a part of the sidewall of the second region 11B, and the second protruding part (B) may be formed on a part of the upper surface of the second region 11B. Furthermore, the upper surface of the second protruding part (B) may be on a same level as the upper surface of the upper insulating layer 12U.

Figure 1D:
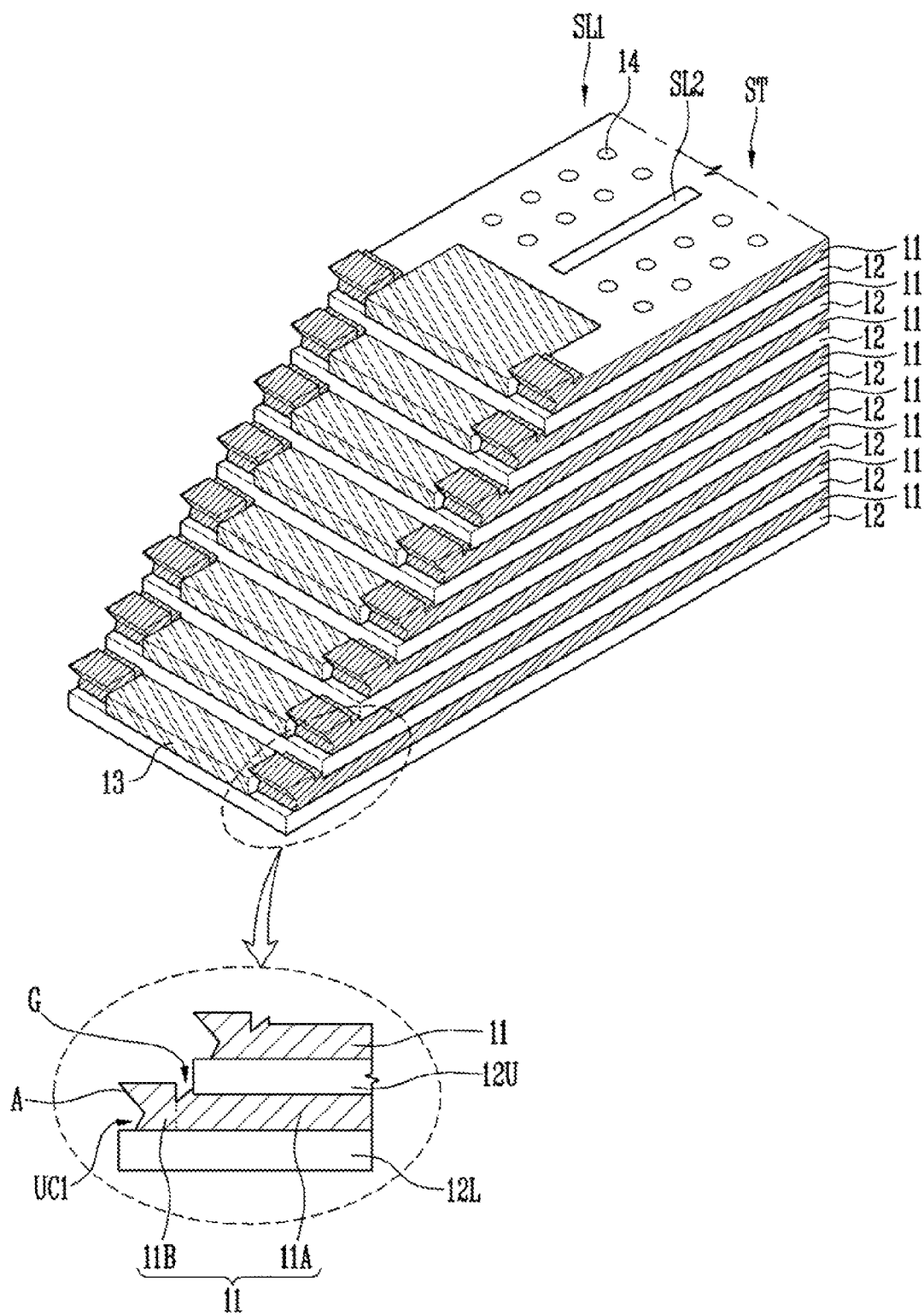

FIG. 1D is a perspective view showing a structure of a semiconductor device according to an embodiment.

As shown in FIG. 1D, the semiconductor device according to an embodiment includes a stacked structure ST including conductive layers 11, insulating layers 12, sacrificial layers 13, semiconductor patterns 14 and a second slit SL2. Further, first slits SL1 are located at both sides of the stacked structure ST.

Referring to the enlarged view, each of the conductive layers 11 includes a first region 11A interposed between upper and lower insulating layers 12U and 12L and a second region 11B protruding from between the upper insulating layer 12U and the lower insulating layer 12L. The second region 11B of the each of the conductive layers 11 may have a greater thickness than the first region 11A and include a first protruding part. A formed on a sidewall of the second region 11B. The first protruding part A includes an inclined lower surface which becomes thinner towards an end. Further, a groove G may be located between the second region 11B of the conductive layer 11 and the upper insulating layer 12U which corresponds to the conductive layer 11.

FIGS. 2A to 2F are cross-sectional views for describing a method of fabricating a semiconductor device according to a first embodiment of the present invention.

Figure 2A:
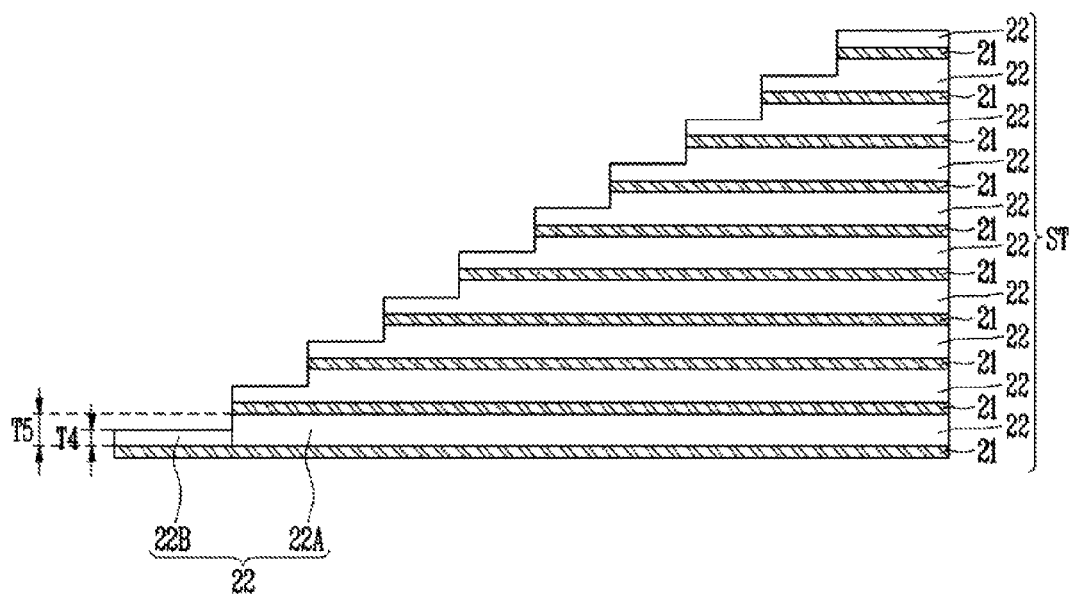
FIGS. 2A to 2F are cross-sectional views for describing a method of fabricating a semiconductor device according to a first embodiment of the present invention.
Figure 2B:
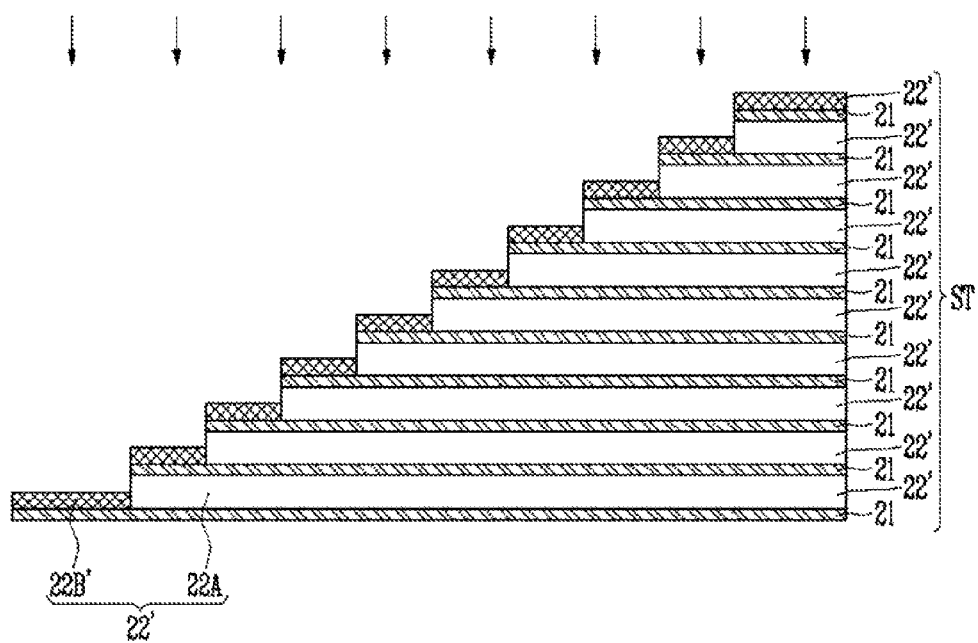

As illustrated in FIG. 2A, a stacked structure ST including first material layers 21 and second material layers 22, which are alternately stacked, is formed. The first material layers 21 form a gate electrode of a select transistor, a memory cell, etc., and the second material layers 22 form an insulating layer configured to electrically divide stacked conductive layers.

The first material layers 21 are formed of a material having a greater etch selectivity with respect to the second material layers 22. For example, the first material layers 21 may be formed of a sacrificial layer including nitride, etc., and the second material layers 22 may be formed of an insulating layer including oxide, etc. Alternatively, the first material layers 21 may be formed of a first sacrificial layer including nitride, etc., and the second material layers 22 may be formed of a second sacrificial layer including oxide, etc. In the embodiment, the first material layers 21 are formed of a sacrificial layer, and the second material layers 22 are formed of an insulating layer.

Next, the first material layers 21 and the second material layers 22 are patterned in the shape of stairs. For example, a sidewall of the stacked structure ST is patterned so that at least one first material layer 21 and at least one second material layer 22 constitute a single layer. Each layer may include an upper second material layer 22 and a lower first material layer 21. In this case, the first material layers 21 are stacked in the shape of stairs, and the second material layers 22 are interposed between the first material layers 21. Further, each of the second material layers 22 includes a first region 22A interposed between the upper first material layer 21 and the lower first material layer 21, and a second region 226 which extends from the first region 22A and covers the lower first material layer 21. The second region 226 of each of the second material layers 22 may be thinner than the first region 22A (T4<T5).

As illustrated in FIG. 26, impurities are doped into second regions 22B' of second material layers 22'. The impurities may include a p-type dopant such as boron (B), etc., an n-type dopant such as phosphorus (P), arsenic (As), etc., or an inert element such as argon (Ar), helium (He), etc. As the impurities are doped into the second regions 22B', the etch rate of the second region 22B' may increase. For example, impurities may be doped using an ion implantation process. In this case, a projected range (Rp) is adjusted so that the impurities are doped into the second regions 22B' of the second material layers 22'.

Figure 2C:
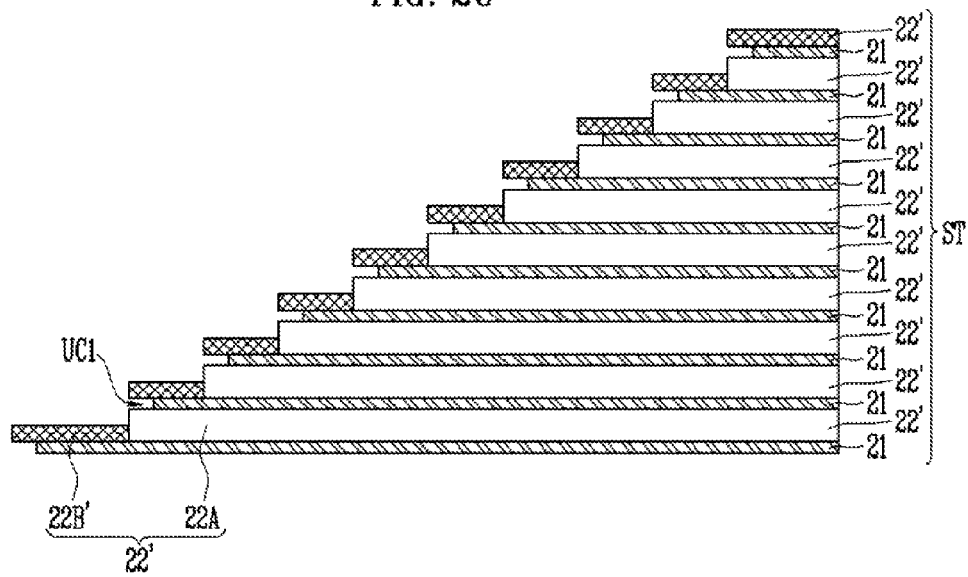

As illustrated in FIG. 2C, first undercuts UC1 are formed under the second material layers 22'. For example, the first undercuts UC1 are formed under the second regions 22B' of the second material layers 22' by etching a part of the first material layers 21. Thus, the second material layers 22' protrude from the first material layers 21. For reference, the first undercuts UC1 may be formed before an impurity doping process.

Figure 2D:
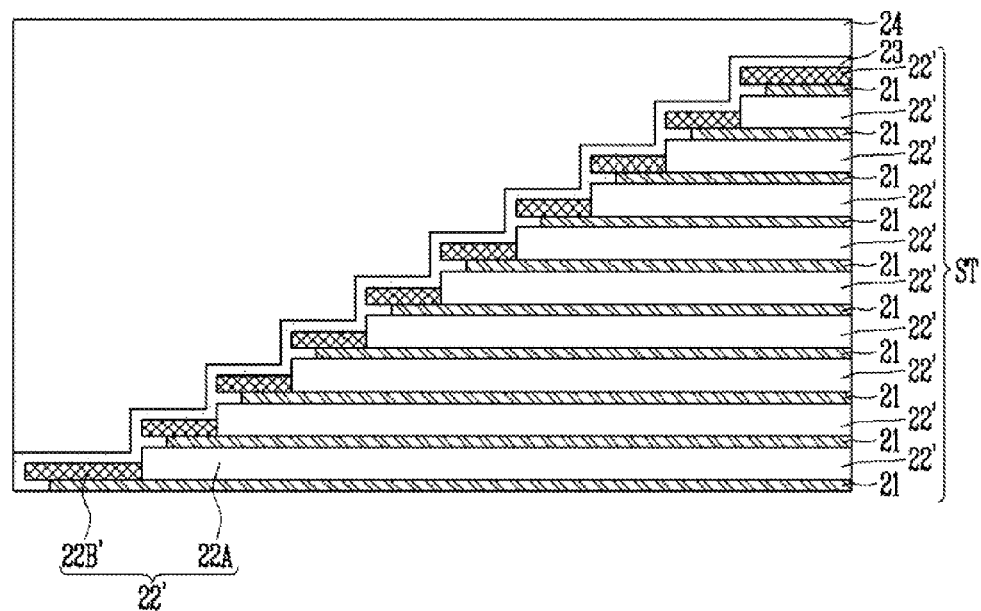

As illustrated in FIG. 2D, a liner layer 23 is formed on the stacked structure ST, and then an interlayer insulating layer 24 is formed. The liner layer 23 fills the first undercuts UC1, and is formed along a side all of the stacked structure ST, which is patterned in the shape of stairs. For example, the liner layer 23 may include oxide material, and may be formed using a chemical vapor deposition (CVD) method, an atomic layer deposition (ALD) method, etc.

Although not shown in this drawing, the stacked structure ST may be divided on the basis of memory blocks. For example, first slits (see SL1 in FIGS. 1A and 1B) passing through the first and second material layers 21 and 22' may be formed and the single stacked structure ST may be divided into a plurality of stacked structures ST.

Further, a semiconductor pattern (see 14 in FIGS. 1A and 1B) passing through the first regions 22A of the second material layers 22' and the first material layers 21 may be formed. For example, a hole passing through the first regions 22A of the second material layers 22' and the first material layers 21 is formed, and then a semiconductor pattern and a memory layer covering the semiconductor pattern is formed in the hole. For example, the memory layer may include a charge blocking layer, a data storage layer, and a tunnel insulating layer. The data storage layer may include a floating gate such as a poly-silicon layer, etc., a charge trap layer such as a nitride layer, etc., a nano dot, a phase change material layer, etc.

Figure 2E:
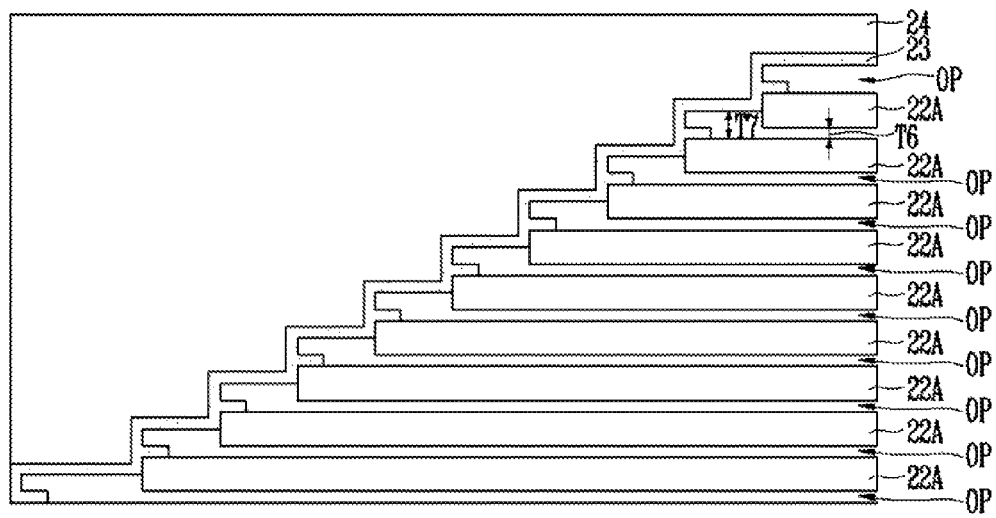

As illustrated in FIG. 2E, opening parts OP are formed by removing the first material layers 21 and the second regions 22B' of the second material layers 22'. For example, a second slit (see SL2 in FIGS. 1A and 1B) passing through the first and second material layers 21 and 22' is formed, and then the opening parts are formed by removing the first material layers 21 exposed through the second slit. Because the etch rate of the second regions 22B' of the second material layers 22' increases by impurity doping, the second regions 22B' of the second material layers 22' may be removed together when the first material layers 21 are removed. Therefore, each of the opening parts OP has a shape where the thickness is greater at the end (T7>T6). Further, protruding parts are formed on sidewalls of the opening parts OP. For reference, although the second regions 22B' of the second material layers 22' are described as being completely removed in the drawing, the second regions 22B' may not be completely removed but may remain.

Figure 2F:
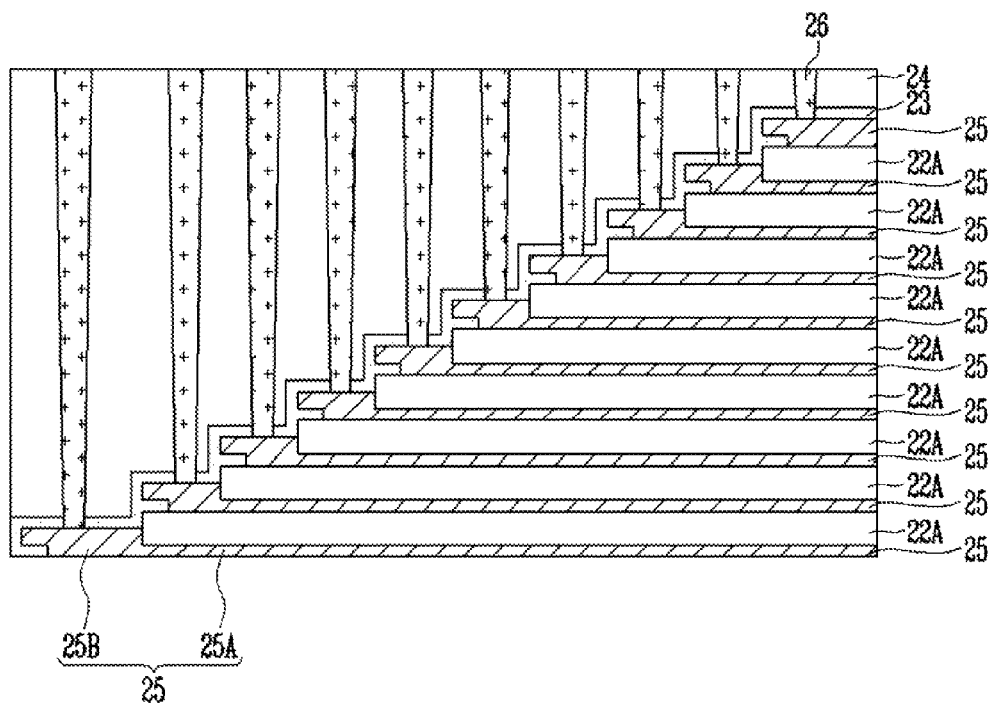

As illustrated in FIG. 2F, conductive layers 25 are formed in the opening parts OP. Each of the conductive layers 2 includes a third region 25A interposed between the second material layers 22 and a fourth region 25B which extends from the third region 25A and protrudes between the upper second material layers 22 and the lower second material layers 22. Further, the conductive layers 25 may include protruding parts formed on sidewalls of the fourth regions

25B. For reference, a memory layer may be further formed in the opening parts before the conductive layers 25 are formed.

Next, contact plugs 26 connected to the fourth regions 25B of the conductive layers 25 are formed to pass through the interlayer insulating layer 24 and the liner layer 23.

For reference, a part of the above-described process may be changed depending on materials of the first and second material layers 21 and 22. For example, when the first material layers 21 are formed of a first sacrificial layer, and the second material layers 22 are formed of a second sacrificial layer, the opening parts are formed by removing the first and second material layers 21 and 22 through the second slit, and then a process of forming an insulating layer in the opening parts may be further performed.

According to the above-described process, the thickness of the fourth region 25B of the conductive layer 25 may be selectively increased. Further, as the first undercuts UC1 are formed under the protruding parts of the conductive layers 25, the distance between the fourth region 25B of the upper conductive layer 25 and the fourth region 25B of the lower conductive layer 25 may be increased.

FIGS. 3A to 3H are cross-sectional views for describing a method of fabricating a semiconductor device according to a second embodiment of the present invention.

Figure 3A:
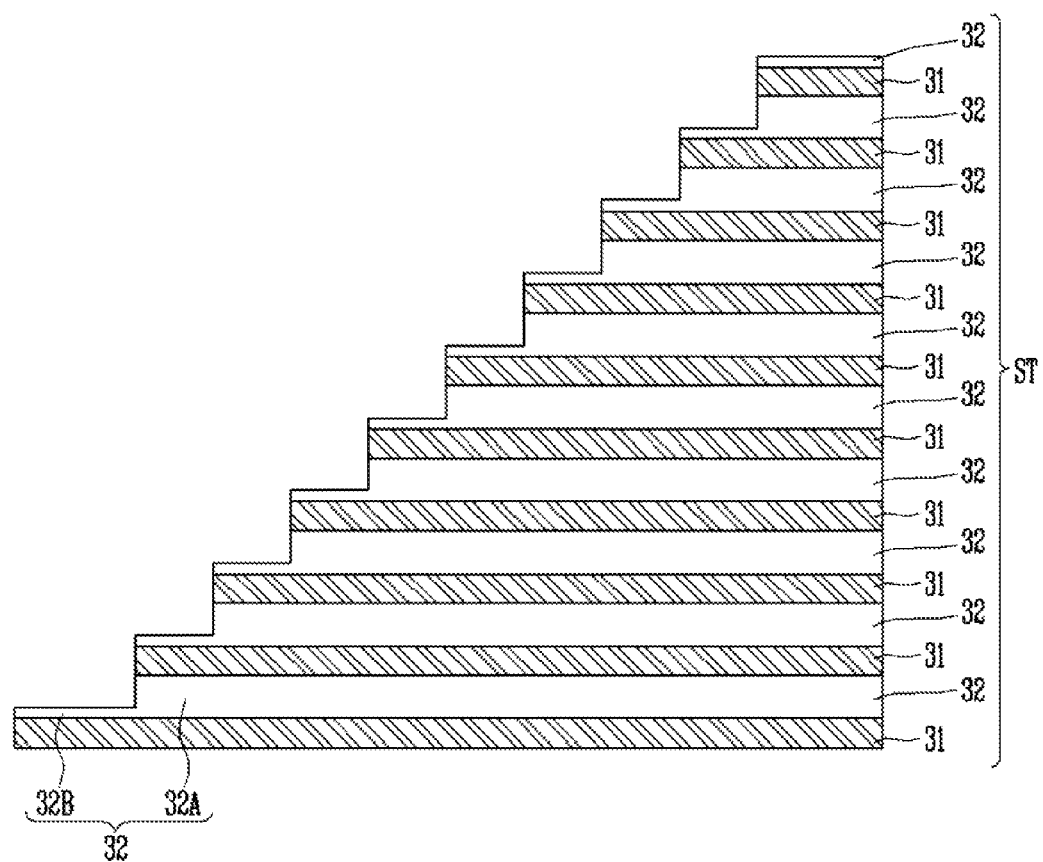
FIGS. 3A to 3H are cross-sectional views for describing a method of fabricating a semiconductor device according to a second embodiment of the present invention.

As illustrated in FIG. 3A, a stacked structure ST including first material layers 31 and second material layers 32, which are alternately stacked, is formed, and then a sidewall thereof is patterned in the shape of stairs. Each of the second material layers 32 includes a first region 32A interposed between the upper first material layer 31 and the lower first material layer 31, and a second region 32B which extends from the first region 32A and covers the lower first material layer 31.

Figure 3B:
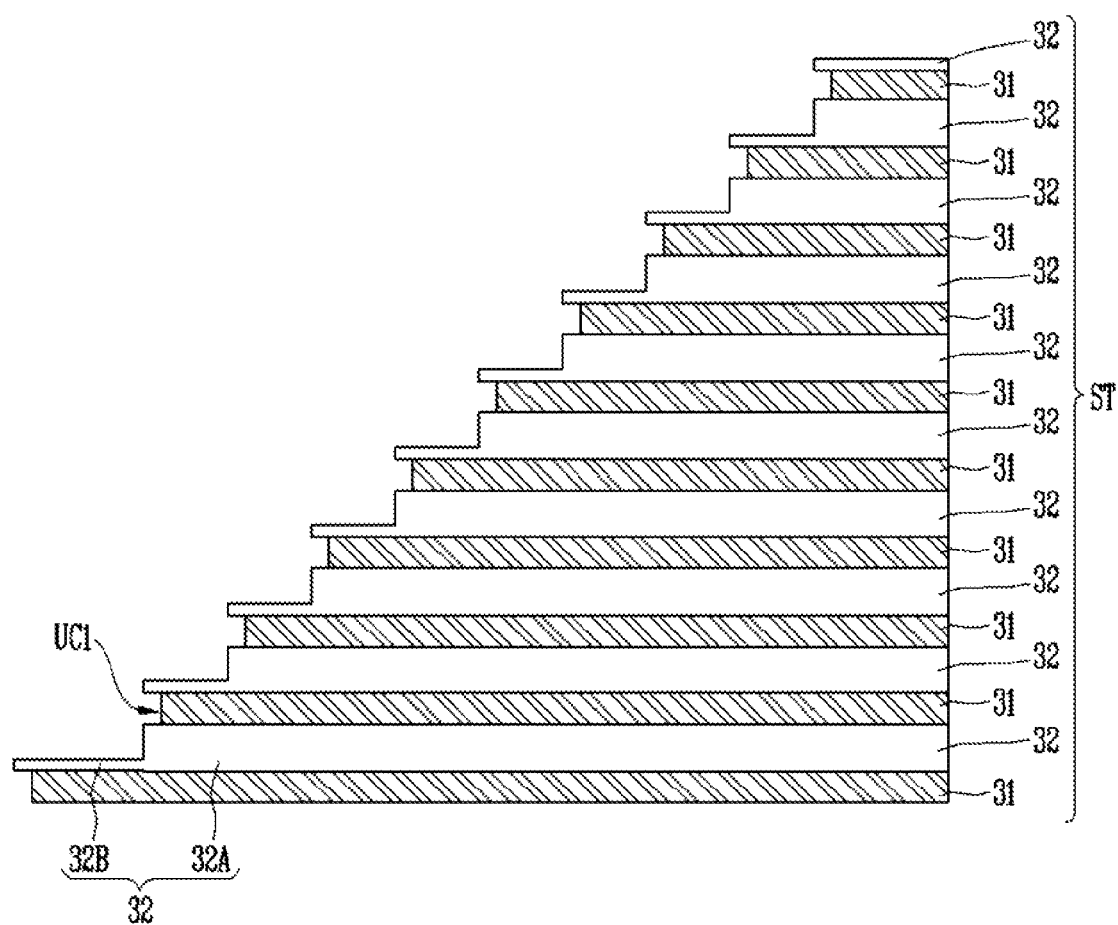

As illustrated in FIG. 3B first undercuts UC1 are formed under the second material layers 32. For example, the first undercuts UC1 are formed under the second regions 32B of the second material layers 32 by etching parts of the first material layers 31. Thus, the second material layers 32 protrude from the first material layers 31.

Figure 3C:
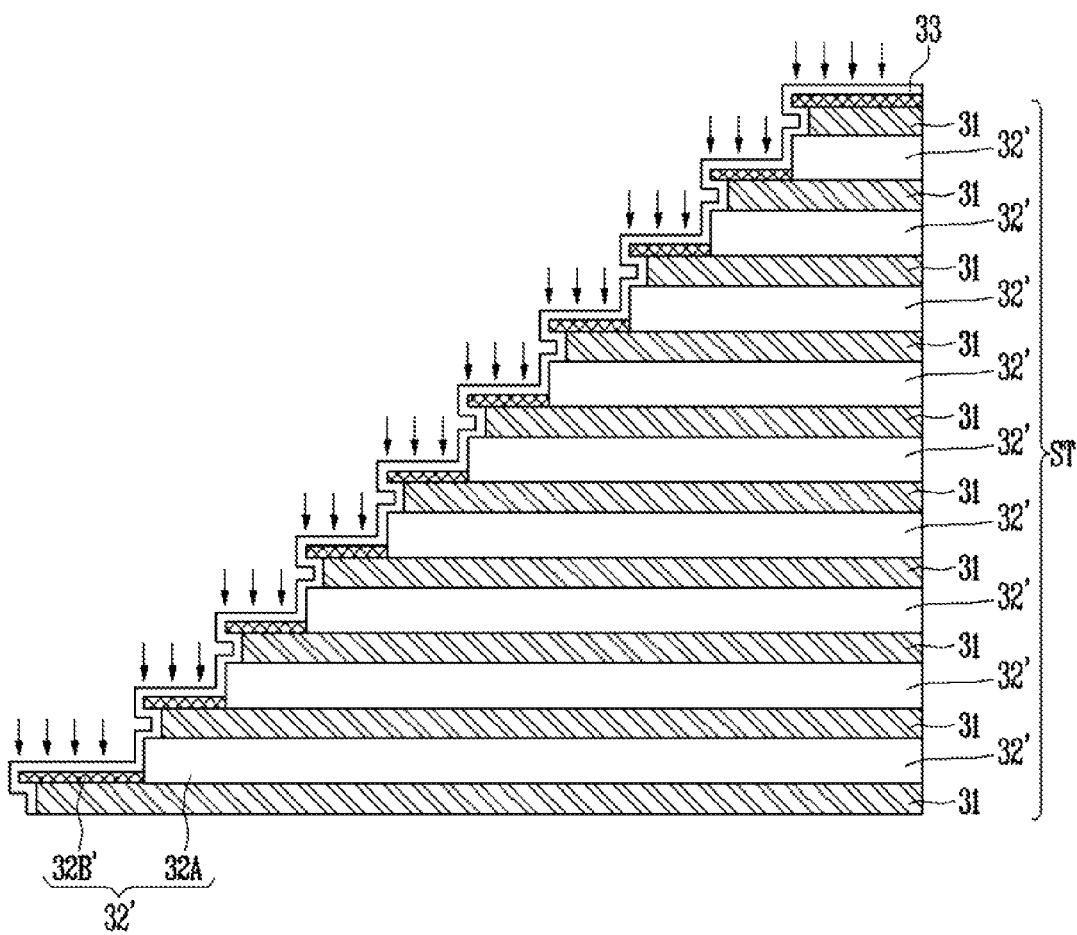

As illustrated in FIG. 3C, a third material layer 33 is formed on the stacked structure ST in which the first undercuts UC1 are formed. The third material layer 33 is formed of a material having a greater etch selectivity with respect to the second material layers 32. For example, the third material layer 33 includes nitride or silicon.

The third material layer 33 may be formed to have a thickness such that the first undercuts UC1 are not entirely filled. Further, the third material layer 33 may be formed using a method having excellent step coverage, such as a low pressure chemical vapor deposition (LPCVD) method, etc. For example, the third material layer 33 may be a nitride layer or a silicon layer formed using the LPCVD method.

Next, impurities are doped into second regions 32B' of second material layers 32'. Compared with the embodiment described with reference to FIG. 2B, the second region 32B' of the second material layer 32' has a relatively small thickness. Therefore, the level of impurity doping may be reduced. Impurities may be partially doped on the third material layer 33 formed on the second region 32B'. Therefore, etch rates of the third material layer 33 and the second region 32B' increase.

Figure 3D:
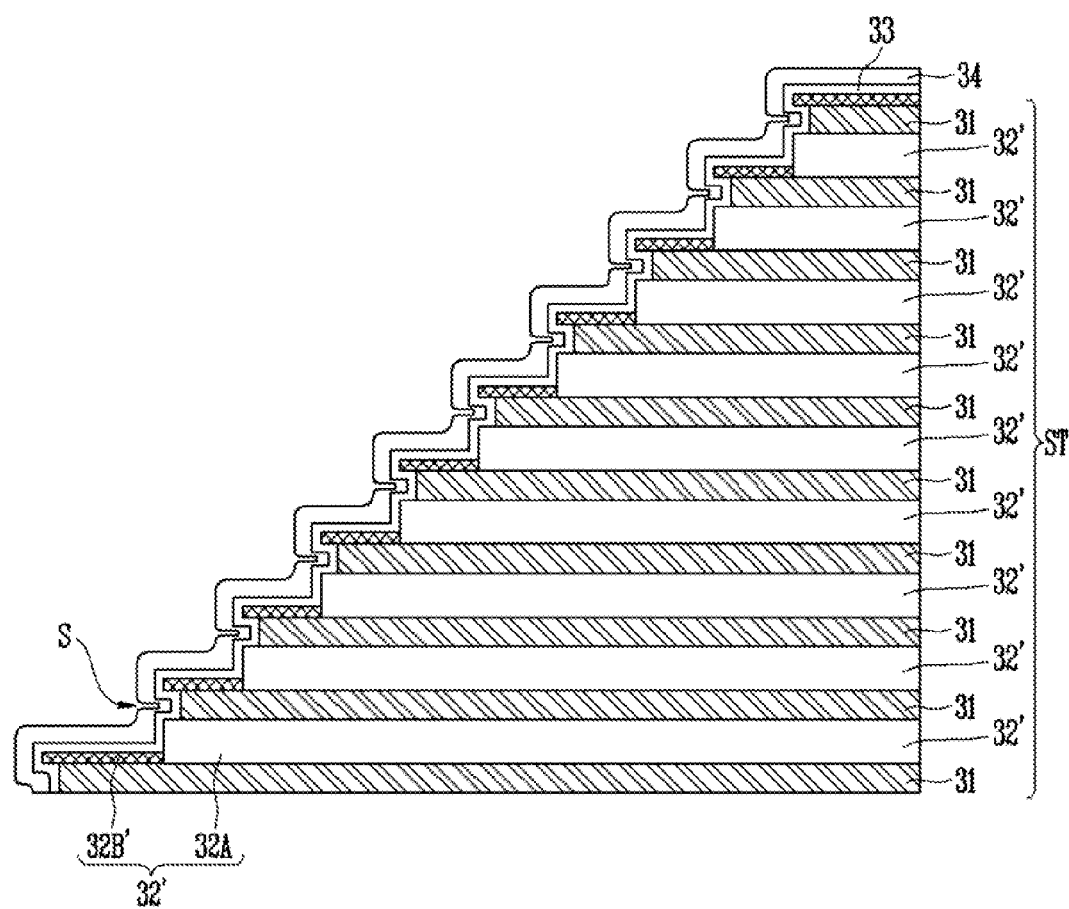

As illustrated in FIG. 3D, an insulating layer 34 is formed on the third material layer 33. The insulating layer 34 may include oxide material. Further, the insulating layer 34 may be formed using a method having relatively poor step coverage, such as a plasma enhanced chemical vapor deposition (PECVD) method, etc. In this case, while the insulating layer 34 is thick in a horizontal region of the stacked structure ST, the insulating layer 34 is formed to be thin in a vertical region of the stacked structure ST, i.e., the sidewall of the stacked structure ST. Therefore, the insulating layer 34 is thick in the second region 32B', and the insulating layer 34 is not filled and a seam S is formed in the first undercuts UC1. The seam S is a vacant space made in the process of forming the insulating layer 34 in the first undercuts UC1 that have a relatively small width. The seam S, having a small width, may be extended from the outside to the inside of the first undercuts UC1.

Figure 3E:
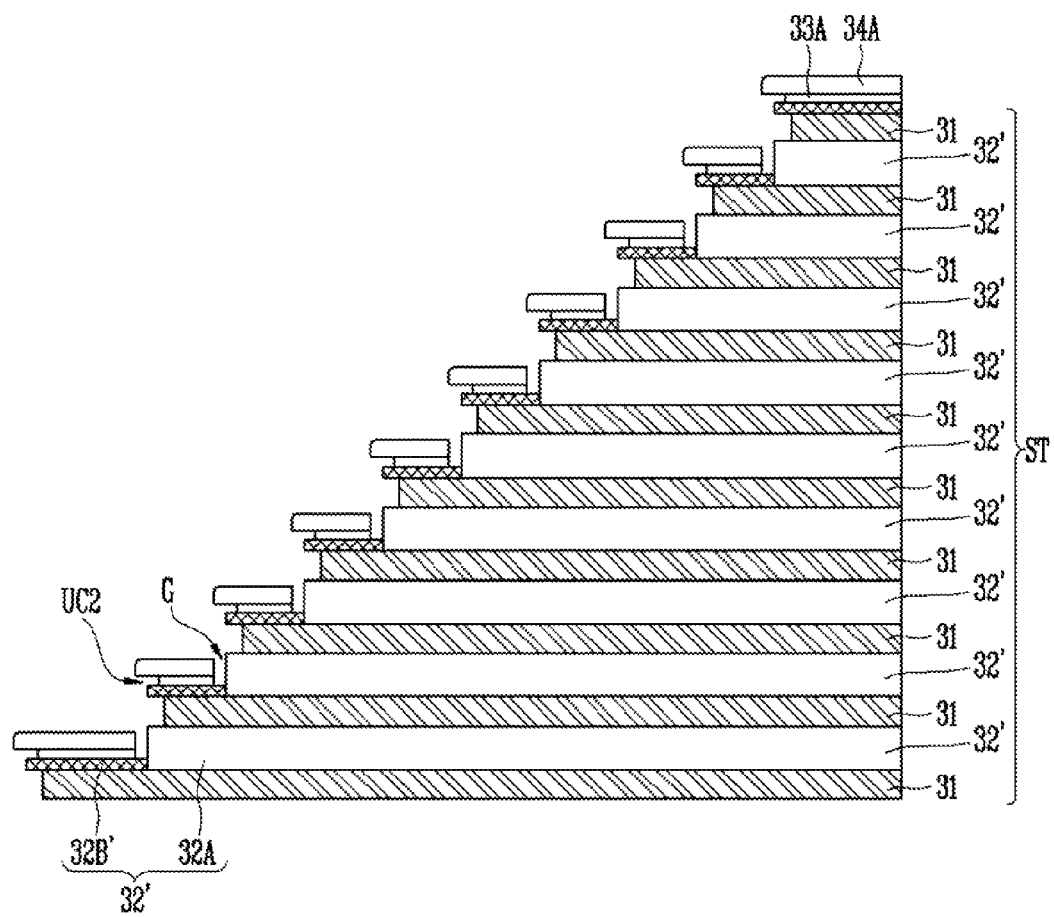

As illustrated in FIG. 3E, insulating patterns 34A are formed by etching the insulating layer 34. For example, when the insulating layer 34 is etched using a wet etching process, an etching solution flows into the seam S, and the insulating layer 34 formed in the first undercuts UC1 is etched. Therefore, the insulating layer 34 formed in the first undercuts UC1 is removed, and the insulating patterns 34A located on the second regions 32B' of the second material layers 32' are formed.

Third material patterns 33A are formed by etching the third material layer 33 in which the insulating patterns 34A are used as a barrier. Because regions uncovered by the insulating patterns 34A are etched, the third material patterns 33A are located under the insulating patterns 34A, respectively. The insulating patterns 34A may protrude more than the third material patterns 33A. Therefore, second undercuts UC2 located between the second regions 32B' of the second material layers 32' and the insulating patterns 34A corresponding thereto may be formed. Further, a groove G located between each of the third material patterns 33A and the first region 32A of the corresponding second material layer 32' may be formed.

Figure 3F:
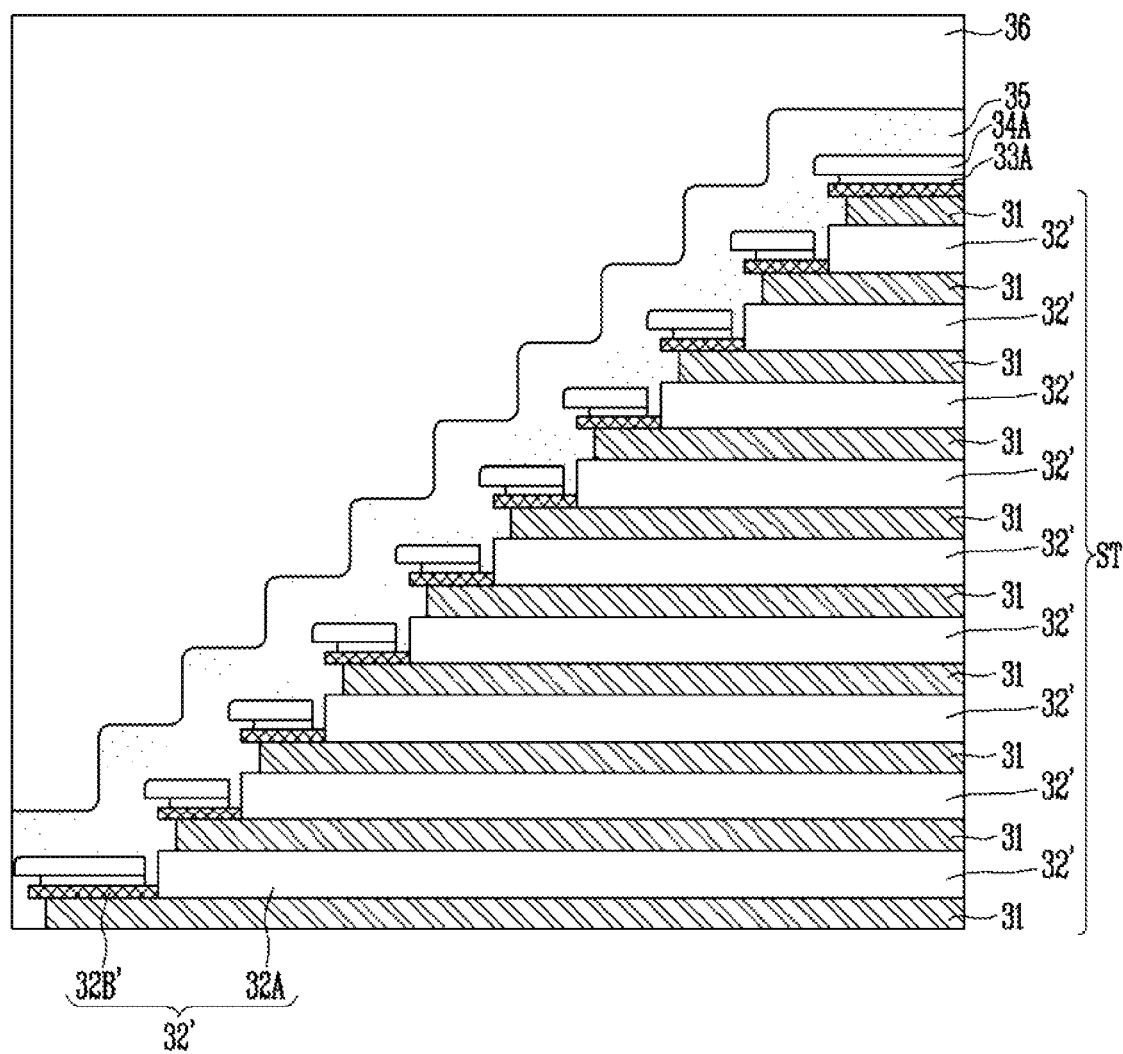

As illustrated in FIG. 3F, a liner layer 35 is formed on the stacked structure ST, and then an interlayer insulating layer 36 is formed. The liner layer 35 fills the first undercuts UC1, the second undercuts UC2, and the grooves G, and is formed along a sidewall of the stacked structure ST patterned in the shape of stairs.

Next, although not shown in this drawing, the stacked structure ST may be divided on the basis of memory blocks. Further, a semiconductor pattern (see 14 in FIGS. 1A and 1B) passing through the first regions 32A of the second material layers 32' and the first material layers 31 may be formed.

Figure 3G:
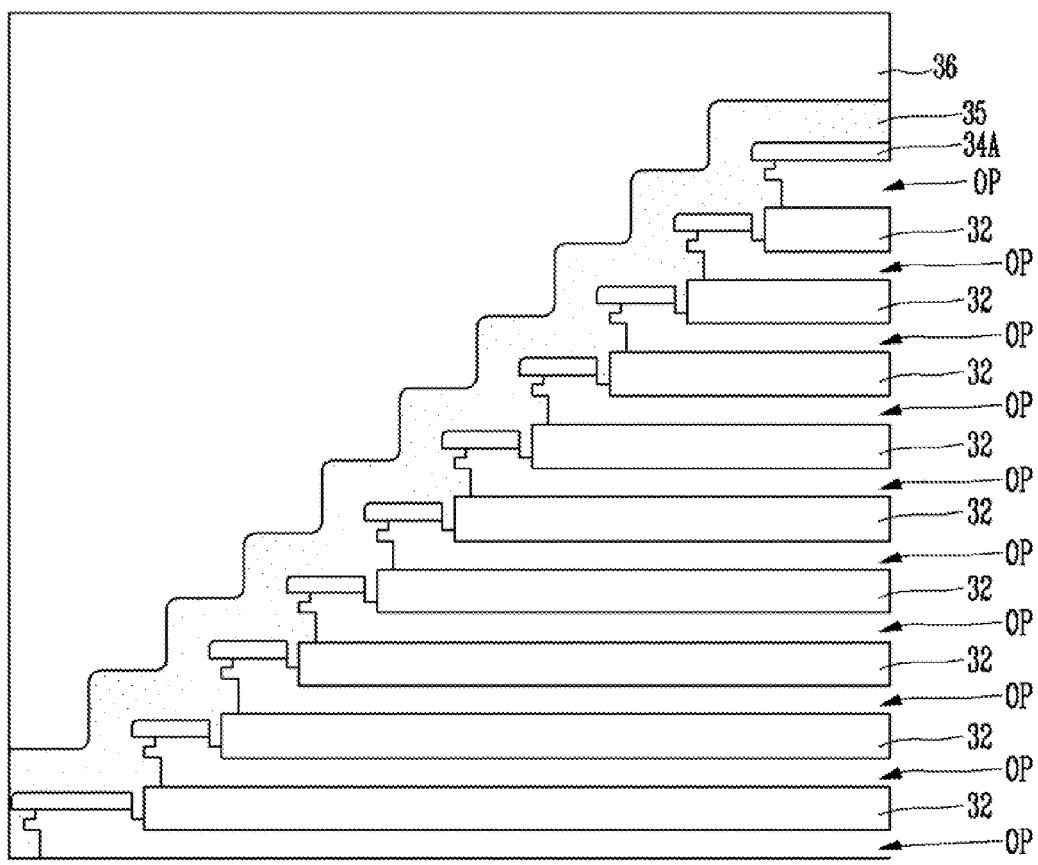

As illustrated in FIG. 3G, opening parts OP are formed by moving the first material layers 31 and the second regions 32B' of the second material layers 32'. Because the etch rate of the second regions 32B' of the second material layers 32' increases by the impurity doping, the second regions 32B' of the second material layers 32' may be removed together when the first material layers 31 are removed. Further, when the opening parts OP are formed, the third material patterns 33A may also be removed. For example, when both of the first material layers 31 and the third material patterns 33A include nitride, the third material patterns 33A may be removed together when the first material layers 31 are removed. Alternatively, when the first material layers 31 include silicon, the first material layers 31 and the second regions 32B' are removed, and then the third material patterns 33A are removed. Thus, the opening parts OP where the thickness increases at the end, and having a protruding part on a sidewall thereof, may be formed.

Figure 3H:
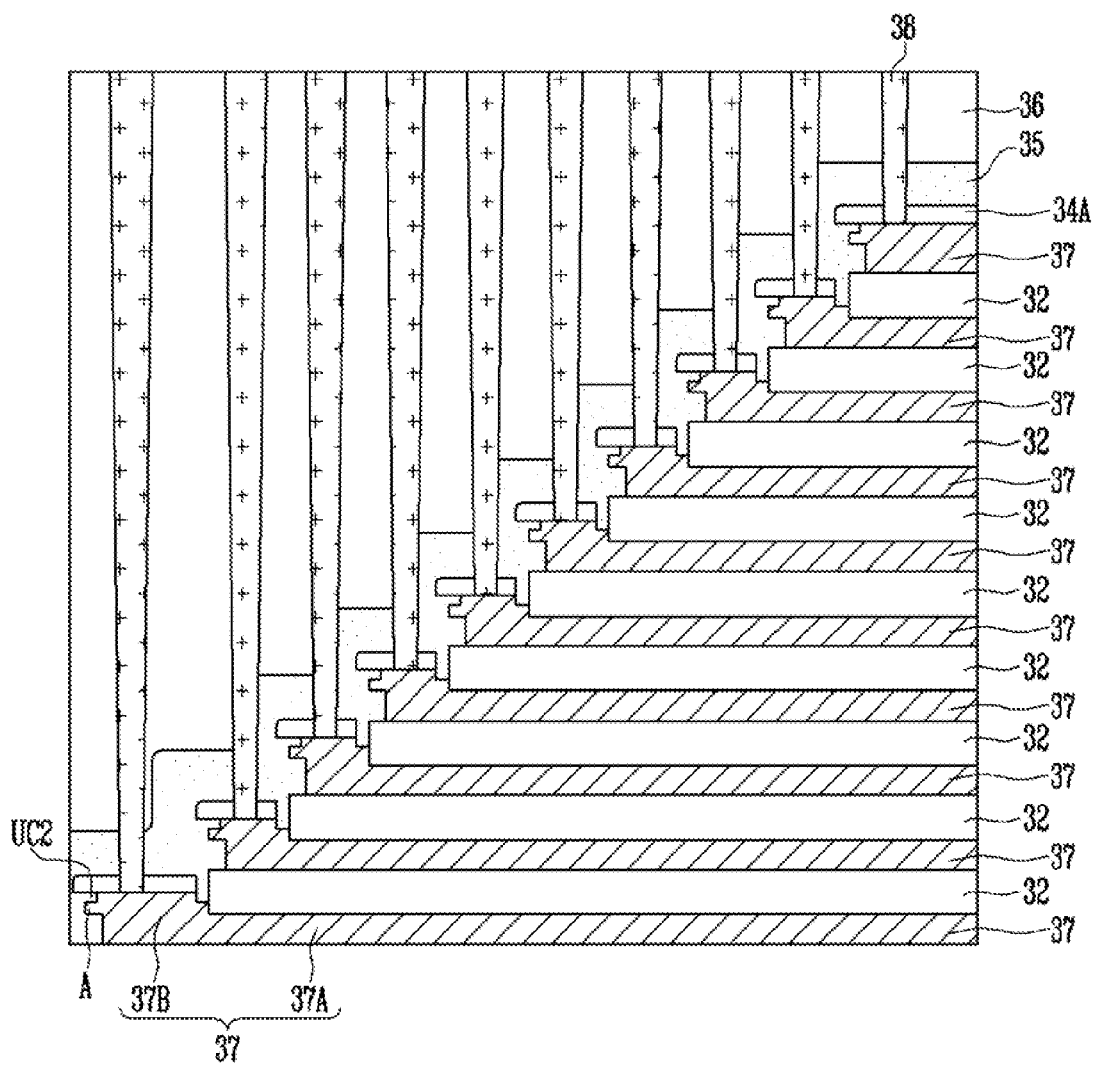

As illustrated in FIG. 3H, conductive layers 37 are formed in the opening parts OP. Each of the conductive layers 37 includes a third region 37A interposed between the second material layers 32 and a fourth region 37B which extends from the third region 37A and protrudes between the upper second material layer 32 and the lower second material layer 32. Further, each of the conductive layers 37 may include a protruding part A formed on a sidewall of the fourth region 37B. A groove G is located between the fourth region 37B of each of the conductive layers 37 and the corresponding second material layer 32, and the second undercut UC2 is located between the protruding part (A) of each of the conductive layers 37 and the insulating pattern 34A corresponding thereto.

Next, contact plugs 38 connected to the fourth regions 37B of the conductive layers 37 are formed to pass through the interlayer insulating layer 36 and the liner layer 35.

FIGS. 4A to 4D are cross-sectional views for describing a method of fabricating a semiconductor device according to a third embodiment of the present invention.

Figure 4A:
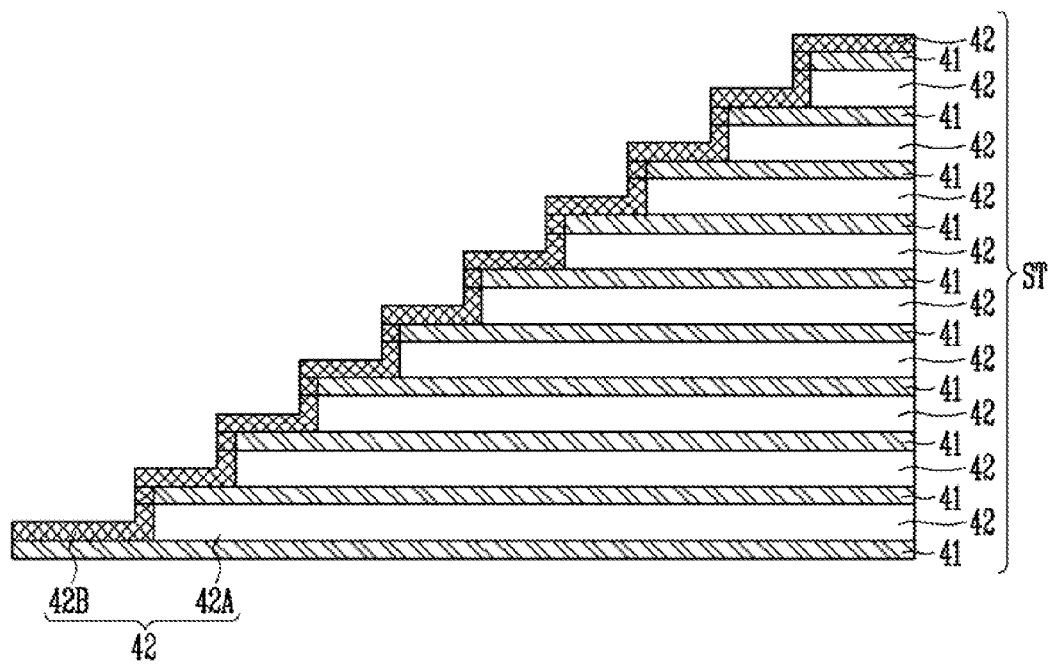
FIGS. 4A to 4D are cross-sectional views for describing a method of fabricating a semiconductor device according to a third embodiment of the present invention.

As illustrated in FIG. 4A, after a stacked structure ST including first material layers 41 and second material layers 42, which are alternately stacked, is formed, a sidewall of the stacked structure ST is patterned in the shape of stairs, Each of the second material layers 42 may include a first region 42A interposed between the upper first material layer 41 and the lower first material layer 41 and a second region 42B extended from the first region 42A and covering the lower first material layer 41.

Next, impurities may be doped on the side all of the stacked structure ST which is patterned in the shape of stairs. For example, the impurities may be doped at a predetermined depth along the stair-shaped sidewall using a plasma doping process. The impurities may be continuously doped along the sidewall, which is patterned in the shape of stairs.

Figure 4B:
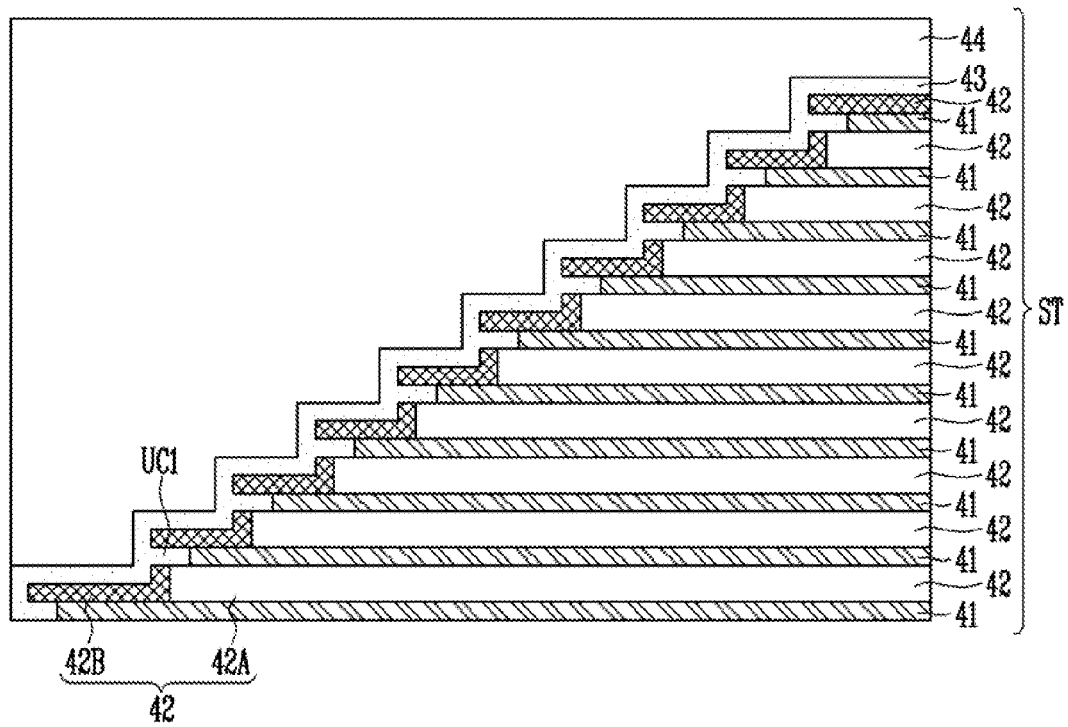

As illustrated in FIG. 4B, first undercuts UC1 may be formed under the second material layers 42. Since part of the impurities are doped in the first material layer 41, which is exposed on the sidewall of the stacked structure ST, the first undercuts UC1 may be formed at a greater depth than the embodiment described in reference to FIG. 2C.

Figure 4C:
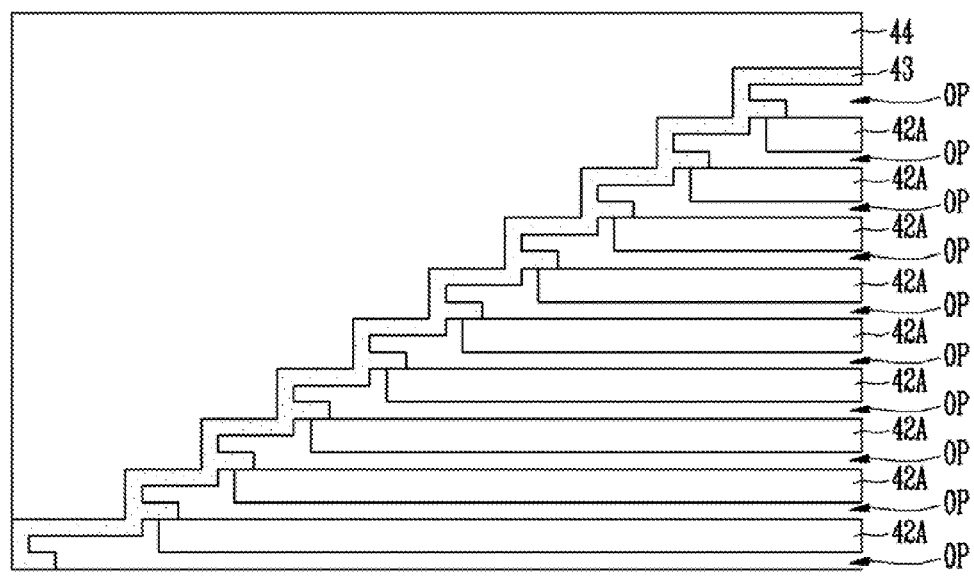

As illustrated in FIG. 4C, opening parts OP may be formed by removing the first material layers 41 and the second regions 42B of the second material layer 42, in which impurities are doped. Each of the opening parts OP may have a thickness that is greater at the end, and protruding parts may be formed on a sidewall and an upper surface of the second region 42B.

Figure 4D:
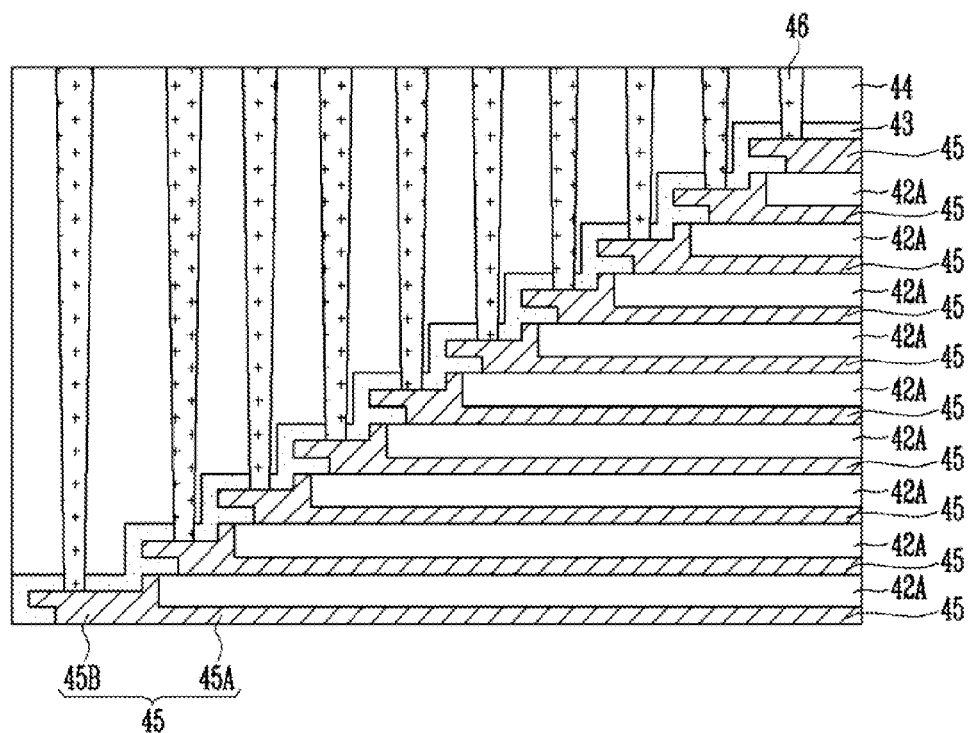

As illustrated in FIG. 4D, conductive layers 45 may be formed in the opening parts OP. Each of the conductive layers 45 may include a third region 45A interposed between the upper and lower second material layers 42A and a fourth region 45B extended from the third region 45A and protruding from between the upper and lower second material layers 42A. Furthermore, the conductive layers 45 may include protruding parts on a sidewall and an upper surface of the fourth region 45B.

Next, contact plugs 46 connected to the fourth regions 45B of the conductive layers 45 are formed to pass through the interlayer insulating layer 44 and the liner layer 43.

FIGS. 5A to 5D are cross-sectional views for describing a method for fabricating a semiconductor device according to an embodiment.

Figure 5A:
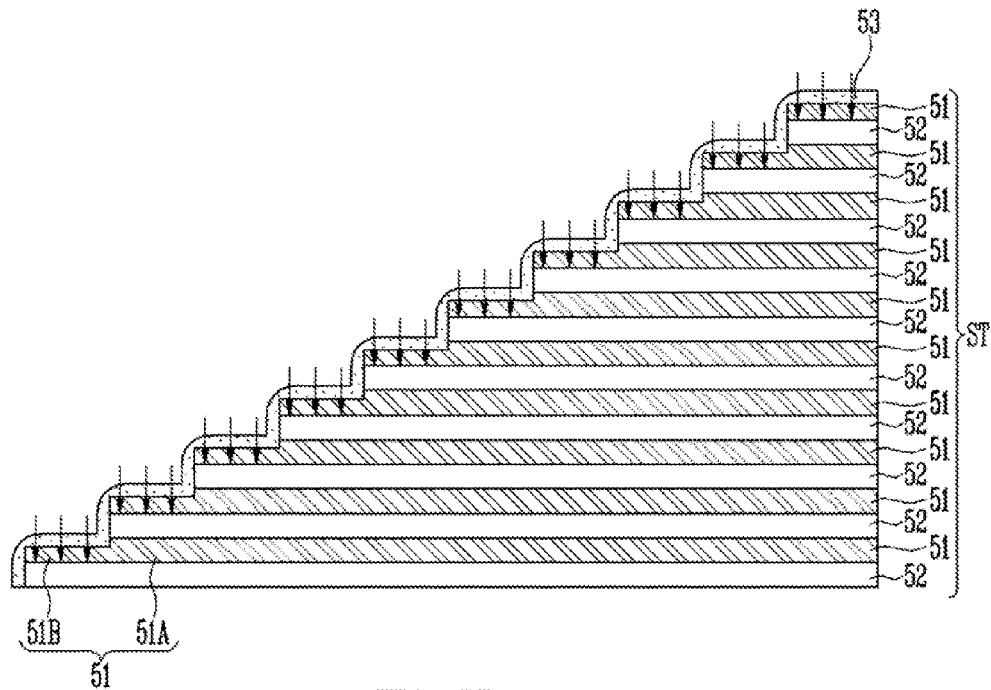
FIGS. 5A to 5D are cross-sectional views for describing a method of fabricating a semiconductor device according to a fourth embodiment of the present invention.

As shown in FIG. 5A, a stacked structure ST is formed. The stacked structure includes alternately stacked first and second material layers 51 and 52. A side all of the stacked structure ST is patterned in the shape of stairs. Each of the first material layers 51 includes a first region 51A interposed between the upper second material layer 52 and the lower second material layer 52 and a second region 51B which extends from the first region 51A and covers the lower second material layer 52. The first material layer 51 may be located on a topmost part of each step.

A third material layer 53 is formed over the stacked structure ST which is patterned in the shape of stairs. For example, the third material layer 53 may be a nitride layer formed using a low pressure-chemical vapor deposition (LP-CVD) method. Further, the third material layer 53 may have roughly uniform thickness along a surface of the stacked structure ST.

Impurities may be doped in a side all of the stacked structure ST. For example, impurities may be doped, to a predetermined depth, along the sidewall in the shape of stairs using an ion implantation process. A projected range Rp may be adjusted such that impurities may be doped into the second region 51B of the first material layers 51.

Figure 5B:
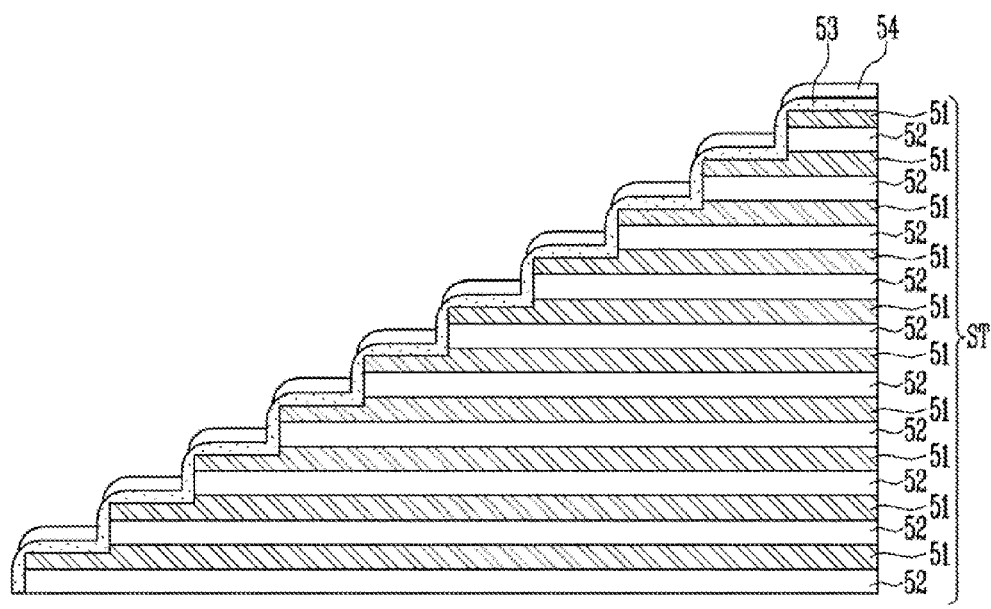

As shown in FIG. 5B, insulating patterns 54 may be formed on the third material layer 53. The insulating patterns 54 may be an oxide layer formed using a high density plasma (HDP) method. For example, the insulating layer may be formed over the third material layer 53 using the HDP method and the insulating patterns 54 may be formed by etching the insulating layer. Since the HDP method may be used and the insulating layer may be thick in a horizontal direction and thin in a vertical direction, the insulating patterns 54 may be formed over the second region 51B of the first material layers 51 by etching the insulating layer.

Figure 5C:
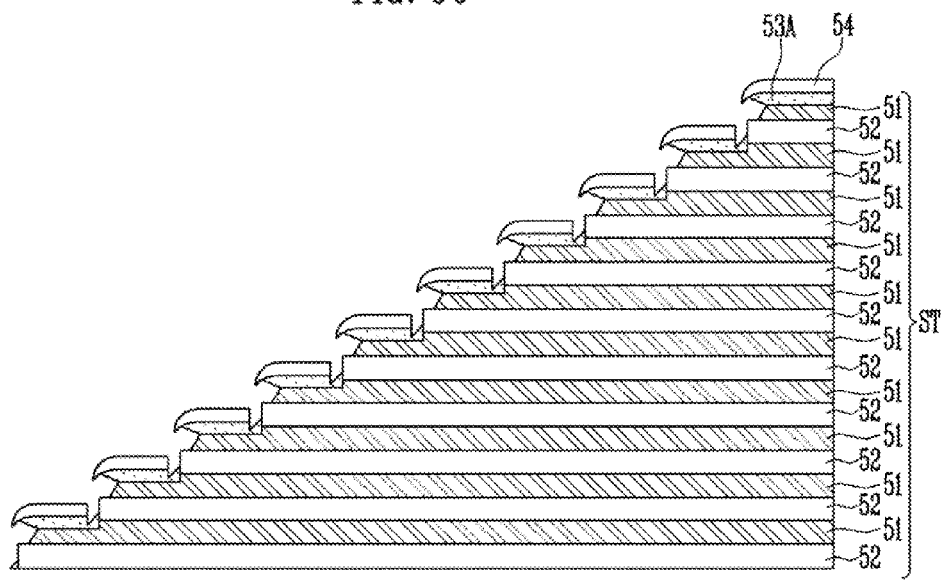

As shown in FIG. 5C, third material patterns 53A and first undercuts UC1 may be formed by partially etching the third material layer 53 and the first material layers 51 using the insulating patterns 54 as an etch barrier. Etching may be completed relatively quickly at the third material layer 53 formed using the LP-CVD method and the second region 51B doped with impurities. Therefore, the third material patterns 53A may be formed under the insulating patterns 54 using the wet etching process and the first undercuts UC1 may be formed under the third material patterns 53A. Further, the groove G may be formed between the third material patterns 53A and the upper second material layer 52 corresponding to the third material pattern 53A.

Figure 5D:
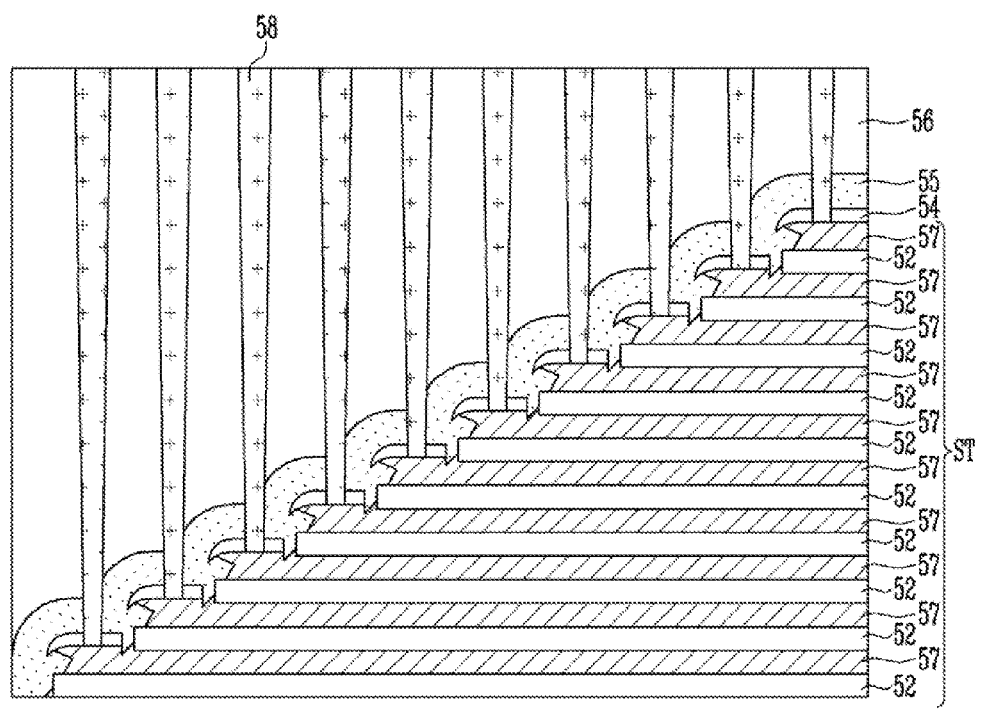

As shown in FIG. 5D, a liner layer 55 may be formed which fills the first undercuts UC1 and the grooves G. For example, the liner layer 55 may be an oxide layer formed by using an atomic layer deposition (ALD) method. And an interlayer insulating layer 56 may be formed over the liner layer 55.

Opening parts may be formed by removing the first material layers 51 and the third material patterns 53A. Thickness of end terminals of each of the opening parts increases, and a protruding part may be formed on the side all. Conductive layers 57 may be formed in the opening parts. Each of the conductive layers 57 includes a third region 57A interposed between the second material layers 52 and a fourth region 57B extending from the third region 57A and protruding from between the upper second material layer and the lower second material layer 52. Further the conductive layers 57 include a protruding part formed on the sidewall of the fourth region 57B. Contact plugs 58 are formed which may be respectively coupled to the fourth region 57B of the conductive, layers 57 by passing through the interlayer insulating layer 56 and the liner layer 55.

Figure 6:
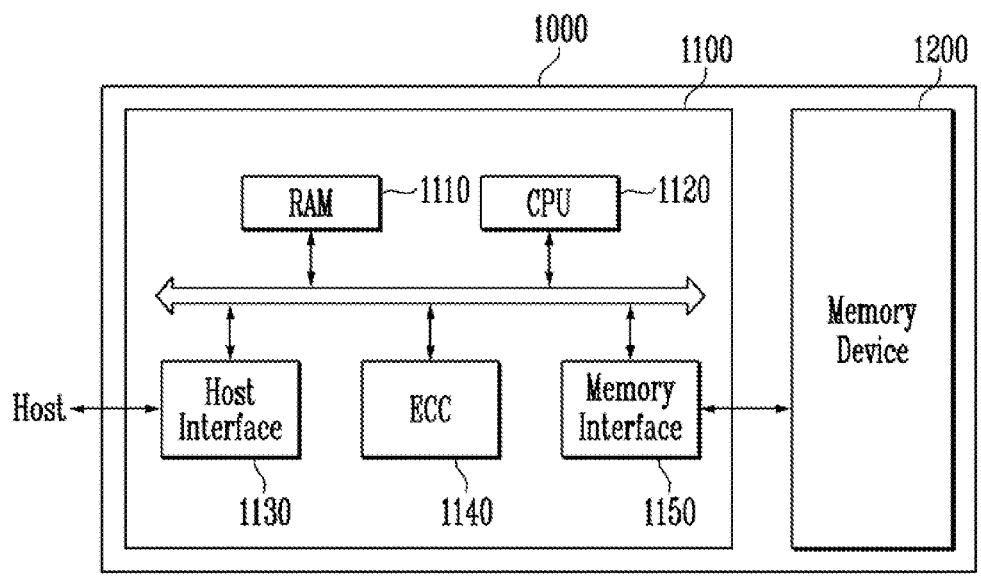
FIGS. 6 and 7 are a block diagram showing a configuration of a memory system according to an embodiment of the present invention.

FIG. 6 is a block diagram showing a configuration of a memory system according to an embodiment of the present invention.

As illustrated in FIG. 6, a memory system 1000 according to the embodiment of the present invention includes a memory device 1200 and a controller 1100.

The memory device 1200 is used to store various types of data such as text, graphics, software code, etc. The memory device 1200 may be a nonvolatile memory, and may include the structure described with reference to FIGS. 1A to 5D. Further, the memory device 1200 may include insulating layers and conductive layers alternately stacked in the shape of stairs. The conductive layers each includes a first region interposed between upper and lower insulating layers and a second region which extends from the first region and protrudes between the upper and lower insulating layers, wherein the protruding part is formed on a sidewall or an upper surface of the second region. Since the structure and fabricating method of the memory device 1200 is the same as described above, a detailed description will be omitted.

The controller 1100 is connected to a host and the memory device 1200, and is configured to access the memory device 1200 in response to a request from the host. For example, the controller 1100 is configured to control read, write, erase, and background operations of the memory device 1200.

The controller 1100 includes a random access memory (RAM) 1110, a central processing unit (CPU) 1120, a host interface 1130, an error correction code (ECC) circuit 1140, a memory interface 1150, etc.

The RAM 1110 may be used as an operation memory of the CPU 1120, a cache memory between the memory device 1200 and the host, a buffer memory between the memory device 1200 and the host, and so on. For reference, the RAM 1110 may be replaced with a static RAM (SRAM), a read only memory (ROM), etc.

The CPU 1120 is configured to control overall operations of the controller 1100, For example, the CPU 1120 is configured to operate firmware such as a Flash Translation Layer (FTL) stored in the RAM 1110.

The host interface 1130 is configured to interface with the host. For example, the controller 1100 communicates with the host through at least one of various interface protocols such as a Universal Serial Bus (USB) protocol, a MultiMediaCard (MMC) protocol, a Peripheral Component Interconnect (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, a private protocol, and so on.

The ECC circuit 1140 is configured to detect and correct errors in data read from the memory device 1200 using the ECC.

The memory interface 1150 is configured to interface with the memory device 1200. For example, the memory interface 1150 includes a NAND interface or a NOR interface.

For reference, the controller 1100 may further include a buffer memory (not shown) in order to temporarily store data. The buffer memory may be used to temporarily store data to be delivered externally through the host interface 1130, or data delivered from the memory device 1200 through the memory interface 1150. Further, the controller 1100 may include a ROM to store code data for interfacing with the host.

According to the embodiments of the present invention there is provided the memory device 1200 which is simple to fabricate and highly integrated and which has a stable structure. Accordingly, the characteristics of the memory system 1000 may be improved and degree of integration may be also enhanced.

Figure 7:
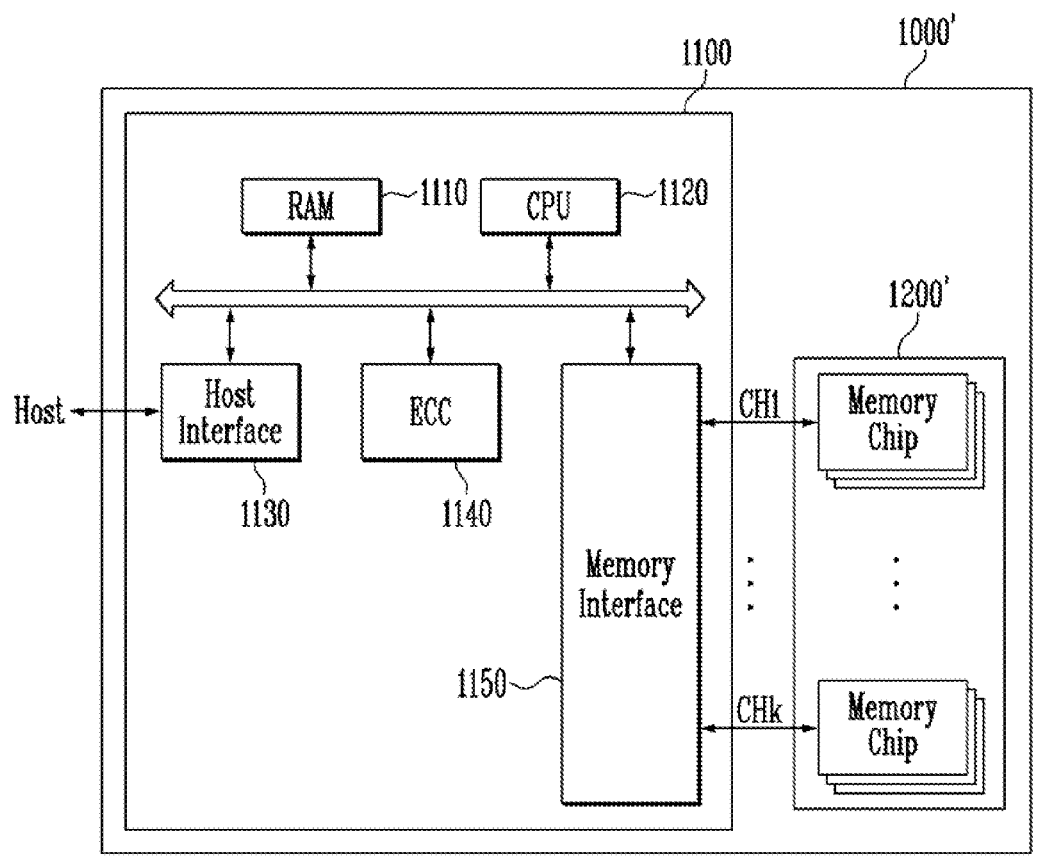

FIG. 7 is a block diagram showing a configuration of a memory system according to another embodiment of the present invention.

As illustrated in FIG. 7, a memory system 1000' according to the embodiments of the present invention includes a memory device 1200' and a controller 1100. Further, the controller 1100 includes a RAM 1110, a CPU 1120, a host interface 1130, an ECC circuit 1140, a memory interface 1150, and so on.

The memory device 1200' may be a nonvolatile memory, and may include the structure described with reference to FIGS. 1A to 4D. Further, the memory device 1200' may include insulating layers and conductive layers alternately stacked in the shape of stairs. The conductive layers each includes a first region interposed between upper and lower insulating layers and a second region which extends from the first region and protrudes between the upper and lower insulating layers, wherein the protruding part is formed on a sidewall or an upper surface of the second region.

Further, the memory device 1200' may be a multi-chip package configured with a plurality of the memory chips. The plurality of memory chips are divided into a plurality of groups, and the plurality of groups are configured to communicate with the controller 1100 through first to $k^{th}$ channels CH1 to CHk. The memory chips belonging to one group are configured to communicate with the controller 1100 through a common channel. For reference, the memory system 1000' may be transformed to connect one channel to one memory chip.

According to the embodiment of the present invention, the memory system 1000' includes the memory device 1200' which is simple to fabricate and highly integrated and which has a stable structure. Accordingly, the characteristics of the memory system 1000' may be improved and degree of integration may be also enhanced. In particular, by configuring the memory device 1200' as a mufti-chip package, data storage capacity of the memory system 1000' may be increased and its driving speed may be improved.

Figure 8:
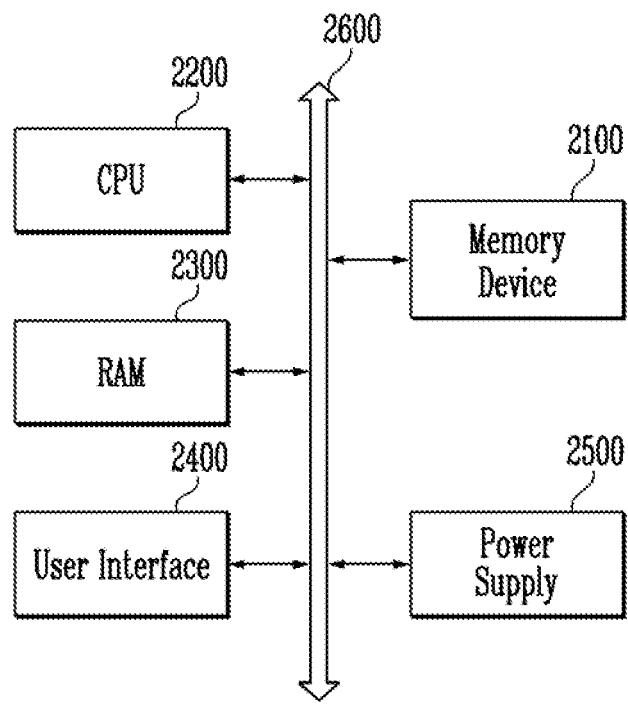
FIGS. 8 and 9 are a block diagram showing a configuration of a computing system according to an embodiment of the present invention.

FIG. 8 is a block diagram showing a configuration of a computing system according to an embodiment of the present invention.

As illustrated in FIG. 8, according to the embodiment of the present invention, a computing system 2000 includes a memory device 2100, a CPU 2200, a RAM 2300, a user interface 2400, a power supply 2500, a system bus 2600, and so on.

The memory device 2100 stores data provided through the user interface 2400, data processed by the CPU 2200, etc. The memory device 2100 is electrically connected to the CPU 2200, the RAM 2300, the user interface 2400, the power supply 2500, and so on through the system bus 2600. For example, the memory device 2100 may be connected to the system bus 2600 through a controller (not shown) or may be directly connected to the system bus 2600. When the memory device 2100 is directly connected to the system bus 2600, the functions of the controller may be performed by the CPU 2200, the RAM 2300, and so on.

The memory device 2100 may be a nonvolatile memory, and may include the structure described with reference to FIGS. 1A to 4D. Further, the memory device 2100 may include insulating layers and conductive layers alternately stacked in the shape of stairs. The conductive layers each includes a first region interposed between upper and lower insulating layers and a second region which extends from the first region and protrudes between the upper and lower insulating layers, wherein a protruding part is formed on a sidewall or an upper surface of the second region. Since the structures and fabricating methods of the memory device 2100 are the same as described above, detailed descriptions will be omitted.

Further, the memory device 2100 may be a multi-chip package configured with a plurality of the memory chips as described with reference to FIG. 7.

The computing system 2000 having such a configuration may be a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console a navigation device, a black box, a digital camera, a 3-dimensional television, a digital audio recorder, a digital audio player, a digital picture recorder, a digital picture player, a digital video recorder, a digital video player, a device for wirelessly sending and receiving information, at least one of various electronic devices configuring a home network, a computer network, or a telematics network, a radio-frequency identification (RFID) device, etc.

According to the embodiments of the present invention, there is provided the memory device 2100 which is simple to fabricate and highly integrated and which has a stable structure. Accordingly, the characteristics of the computing system 2000 may be improved and data storage capacity may be also enhanced.

Figure 9:
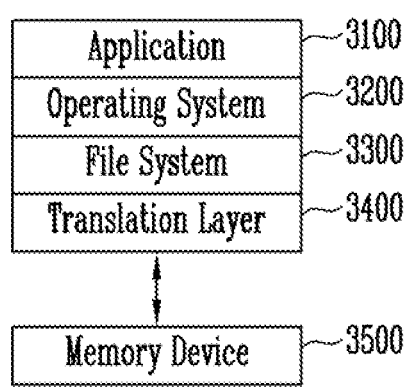

FIG. 9 is a block diagram showing a computing system according to another embodiment of the present invention.

As illustrated in FIG. 9, according to the embodiment of the present invention, a computing system 3000 includes a software layer having an operating system 3200, an application 3100, a file system 3300, a translation layer 3400, etc. Further, the computing system 3000 includes a hardware layer such as a memory device 3500, etc.

The operating system 3200 manages software resources and hardware resources of the computing system 3000, and may control program execution by the CPU. The application 3100 may be various application programs executed in the computing system 3000, and may be a utility executed by the operating system 3200.

The file system 3300 is a logical structure to manage data, files, etc., in the computing system 3000 and organizes files or data to be stored in the memory device 3500 according to rules. The file system 3300 may be determined by the operating system 3200 used in the computing system 3000. For example, when the operating system 3200 is Microsoft Windows, the file system 3300 may be File Allocation Table (FAT), NT File System (NTFS), etc. Further, when the operating system 3200 is Unix/Linux, the file system 3300 may be an extended file system (EXT), a Unix File System (UFS), a Journaling File System OFS), etc.

In this drawing, although the operating system 3200, the application 3100, and a file system 3300 are shown as separate blocks, the application 3100 and the file system 3300 may be included in the operating system 3200.

A translation layer 3400 translates an address into an appropriate type for the memory device 3500 in response to a request from the file system 3300. For example, the translation layer 3400 translates a logical address created by the file system 3300 into a physical address of the memory device 3500. Mapping information of the logical address and the physical address may be stored in an address translation table. For example, the translation layer 3400 may be an FTL, a Universal Flash Storage link layer (ULL), etc.

The memory device 3500 may be a nonvolatile memory, and may include the structure described with reference to FIGS. 1A to 4D. Further, the memory device 3500 may include insulating layers and conductive layers alternately stacked in the shape of stairs. The conductive layers each includes a first region interposed between upper and lower insulating layers and a second region which extends from the first region and protrudes between the upper and lower insulating layers, wherein a protruding part is formed on a sidewall or an upper surface of the second region. Since the structure and fabricating method of the memory device 3500 are the same as described above, detailed descriptions will be omitted.

The computing system 3000 having this configuration may be separated into an operating system layer implemented in an upper level region and a controller layer implemented in a lower level region. The application 3100, the operating system 3200, and the file system 3300 may be included in the operating system layer, and may be driven by an operating memory of the computing system 3000. The translation layer 3400 may be included in the operating system layer or the controller layer.

According to the embodiments of the present invention, there is provided the memory device 3500 which is simple to fabricate and highly integrated and which has a stable structure. Accordingly, the characteristics of the computing system 3000 may be improved and data storage capacity may be also enhanced.

Thicknesses of the ends of the stacked conductive layers are selectively increased. Therefore, without increasing the height of the stacked structure, a bridge that occurs when the contact plug is formed may be prevented.

While the spirit and scope of the invention is described by detailed exemplary embodiments of the invention, it should be noted that the above-described embodiments are merely descriptive and should not be considered limiting. Further, it should be understood by those skilled in the art that various changes, substitutions, and alterations may be made herein without departing from the scope of the invention as defined by the following claims.

What is claimed is:

1. A semiconductor device, comprising:
   insulating layers stacked in the shape of stairs; and
   conductive layers alternately stacked with the insulating layers,
   wherein the conductive layers each include a first region interposed between upper and lower insulating layers thereof, among the insulating layers, and a second region which extends from the first region and protrudes between the upper and lower insulating layers, and
   wherein a protruding part is formed on a sidewall of the second region.

2. The semiconductor device of claim 1, further comprising:
   a first undercut formed between the protruding part of each of the conductive layers and the lower insulating layer thereof.

3. The semiconductor device of claim 2, further comprising:
   a liner layer formed on the conductive layers and the insulating layers to fill the first undercut.

4. The semiconductor device of claim 3, further comprising:
   contact plugs connected to second regions of the conductive layers and passing through the liner layer.

5. The semiconductor device of claim 1, further comprising:
   a groove formed between the second region of each of the conductive layers and the upper insulating layer corresponding thereto.

6. The semiconductor device of claim 1, further comprising:
   an insulating pattern formed on the second region of each of the conductive layers; and
   a second undercut formed between the protruding part of each of the conductive layers and the insulating pattern corresponding thereto.

7. The semiconductor device of claim 1, further comprising:

an insulating pattern formed on the second region of each of the conductive layers; and contact plugs connected to second regions of the conductive layers and passing through the insulating pattern.

8. The semiconductor device of claim 1, further comprising:

semiconductor patterns formed to pass through first regions of the conductive layers and the insulating layers.

9. The semiconductor device of claim 1, wherein the second region of each of the conductive layers has a greater thickness than the first region thereof.

10. The semiconductor device of claim 1, wherein the protruding part of each of the conductive layers is formed to extend from the upper surface of the second region thereof.

11. The semiconductor device of claim 1, wherein the protruding part of each of the conductive layers is formed in a center of the sidewall of the second region thereof.

12. The semiconductor device of claim 1, wherein the upper surface of the second region of each of the conductive layers is formed at a level equal to or lower than an upper surface of the upper insulating layer corresponding thereto.

13. The semiconductor device of claim 1, wherein the first region of each of the conductive layers is a word line, and the second region thereof is a pad part.

14. The semiconductor device of claim 1, wherein the protruding part is formed on the sidewall and an upper surface of the second region.

15. A semiconductor device, comprising:

insulating layers stacked in the shape of stairs; and conductive layers alternately stacked with the insulating layers, wherein the conductive layers each include a pad part protruding between upper and lower insulating layers thereof, among the insulating layers, in a shape of a bird's beak.

16. The semiconductor device of claim 15, further comprising:

a liner layer formed on the insulating layers and the conductive layers to cover the pad part of each of the conductive layers.

17. The semiconductor device of claim 16, further comprising:

contact plugs connected to the conductive layers and passing through the liner layer.

18. The semiconductor device of claim 15, further comprising:

a first undercut formed between the pad part of each of the conductive layers and the lower insulating layer corresponding thereto.

19. The semiconductor device of claim 15, further comprising:

a groove formed between the pad part of each of the conductive layers and the upper insulating layer corresponding thereto;

an insulating pattern formed on the pad part of each of the conductive layers; and a second undercut formed between the pad part of each of the conductive layers and the insulating pattern corresponding thereto.

20. The semiconductor device of claim 15, wherein the pad part of each of the conductive layers has a greater thickness than other parts thereof.

* * * * *